(12) United States Patent
Ohba

(10) Patent No.: US 9,061,898 B2
(45) Date of Patent: Jun. 23, 2015

(54) MEMORY DEVICE

(75) Inventor: Ryuji Ohba, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 183 days.

(21) Appl. No.: 13/426,842

(22) Filed: Mar. 22, 2012

(65) Prior Publication Data
US 2013/0082319 A1 Apr. 4, 2013

(30) Foreign Application Priority Data
Sep. 29, 2011 (JP) ................................. 2011-215016

(51) Int. Cl.
H01L 29/00 (2006.01)
H01L 47/00 (2006.01)
B82Y 10/00 (2011.01)
H01L 45/00 (2006.01)
H01L 21/28 (2006.01)
H01L 29/12 (2006.01)
H01L 29/423 (2006.01)
H01L 29/66 (2006.01)
H01L 29/788 (2006.01)

(52) U.S. Cl.
CPC ................. B82Y 10/00 (2013.01); H01L 45/10 (2013.01); H01L 45/14 (2013.01); H01L 21/28273 (2013.01); H01L 29/127 (2013.01); H01L 29/42332 (2013.01); H01L 29/66825 (2013.01); H01L 29/7881 (2013.01)

(58) Field of Classification Search
None
See application file for complete search history.

(56) References Cited

U.S. PATENT DOCUMENTS

| 5,714,766 | A | 2/1998 | Chen et al. |
| 5,937,295 | A | 8/1999 | Chen et al. |
| 6,548,825 | B1 | 4/2003 | Yoshii et al. |
| 6,680,505 | B2 | 1/2004 | Ohba et al. |
| 6,740,928 | B2 | 5/2004 | Yoshii et al. |
| 6,753,568 | B1 * | 6/2004 | Nakazato et al. ............. 257/314 |

(Continued)

FOREIGN PATENT DOCUMENTS

| CN | 1551362 A | 12/2004 |
| JP | 09-116106 | 5/1997 |

(Continued)

OTHER PUBLICATIONS

U.S. Appl. No. 13/419,930, filed Mar. 14, 2012, Ryuji Ohba.

(Continued)

Primary Examiner — Hoang-Quan Ho
(74) Attorney, Agent, or Firm — Oblon, McClelland, Maier & Neustadt, L.L.P.

(57) ABSTRACT

According to one embodiment, a memory device includes the following structure. A first double tunnel junction structure includes a first nanocrystal layer that includes first conductive minute particles, and first and second tunnel insulating films arranged to sandwich the first nanocrystal layer. A second double tunnel junction structure includes a second nanocrystal layer that includes second conductive minute particles, and third and fourth tunnel insulating films arranged to sandwich the second nanocrystal layer. A charge storage layer is arranged between the first and second double tunnel junction structures. First and second conductive layers are arranged to sandwich the first double tunnel junction structure, the charge storage layer, and the second double tunnel junction structure. The first conductive minute particles has an average grain size which is different from that of the second conductive minute particles.

14 Claims, 15 Drawing Sheets

(56) References Cited

U.S. PATENT DOCUMENTS

| | | | |
|---|---|---|---|
| 8,587,050 B2* | 11/2013 | Ohba | 257/315 |
| 2003/0132432 A1* | 7/2003 | Yoshii et al. | 257/17 |
| 2004/0256653 A1 | 12/2004 | Iwata et al. | |
| 2008/0185615 A1* | 8/2008 | Wu | 257/213 |
| 2009/0302365 A1* | 12/2009 | Bhattacharyya | 257/298 |
| 2011/0240949 A1* | 10/2011 | Mitani et al. | 257/4 |
| 2012/0061746 A1 | 3/2012 | Ohba | |
| 2012/0235223 A1 | 9/2012 | Ohba et al. | |

FOREIGN PATENT DOCUMENTS

| | | |
|---|---|---|
| JP | 10-200001 | 7/1998 |
| JP | 2001-313342 | 11/2001 |
| JP | 2002-289709 | 10/2002 |
| JP | 2003-078050 | 3/2003 |
| JP | 2006-190990 | 7/2006 |
| JP | 2006-196601 | 7/2006 |
| JP | 4247188 | 1/2009 |
| JP | 2010-206008 A | 9/2010 |
| WO | WO 2005/101488 | 10/2005 |
| WO | WO 2008/142739 | 11/2008 |
| WO | WO 2009/066697 A1 | 5/2009 |
| WO | WO 2011/036775 A1 | 3/2011 |

OTHER PUBLICATIONS

U.S. Appl. No. 13/427,587, filed Mar. 22, 2012, Ohba, et al.
Office Action issued in Japanese Patent Application No. 2011-532852 on Jul. 9, 2013 with English translation.
Office Action issued in Chinese Application No. 200980160141.7 on Aug. 16, 2013 with English translation.
Office Action issued Jan. 28, 2014 in Japanese Patent Application No. 2011-215016 with English language translation.

* cited by examiner

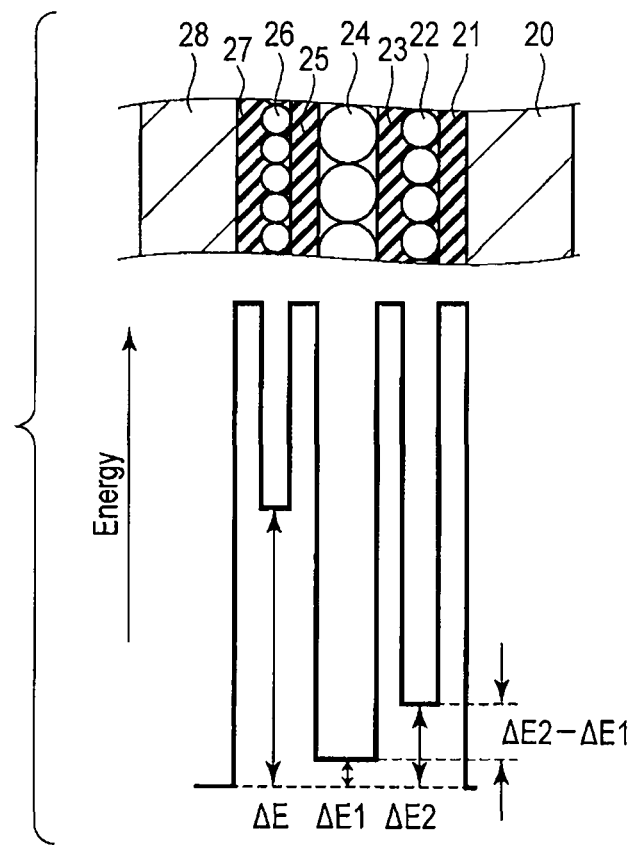
F I G. 11
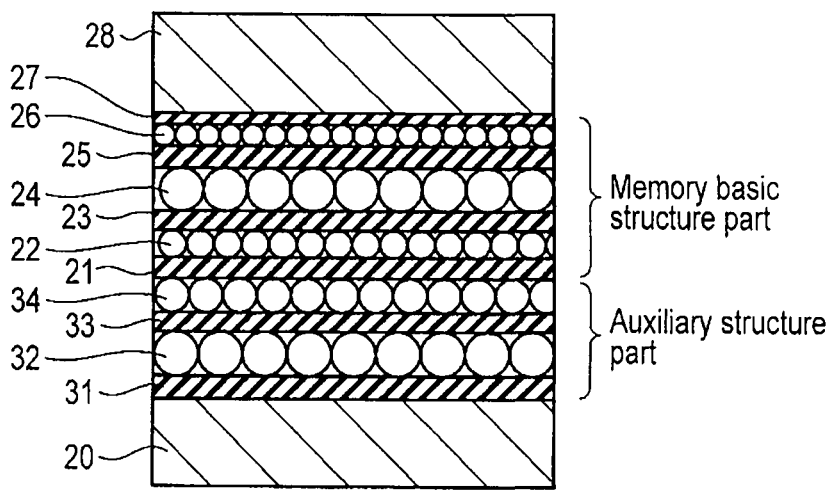
F I G. 12

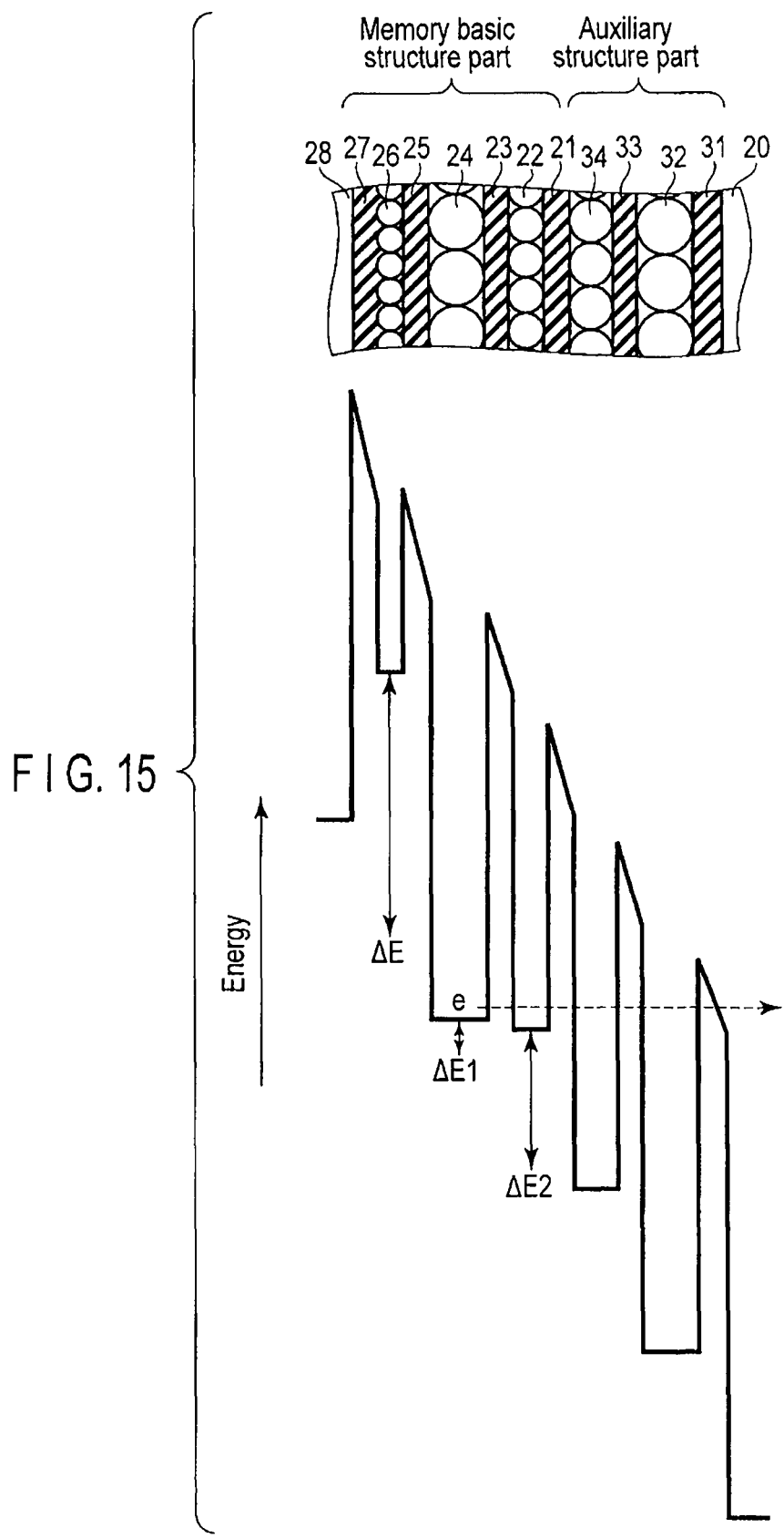

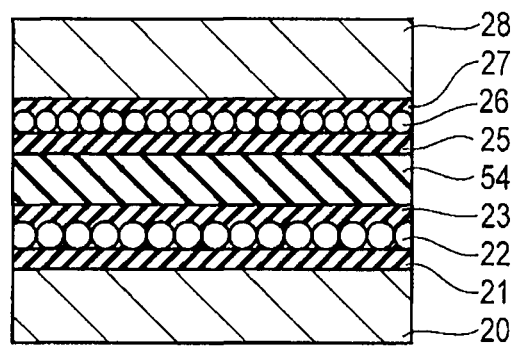
F I G. 19
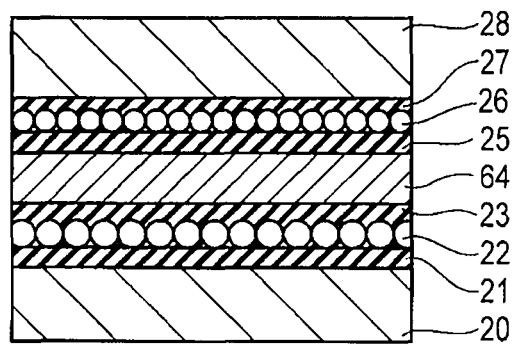
F I G. 20
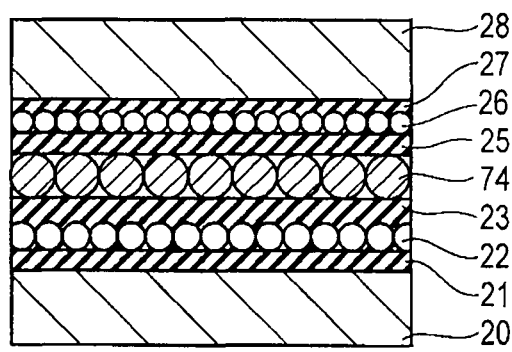
F I G. 21

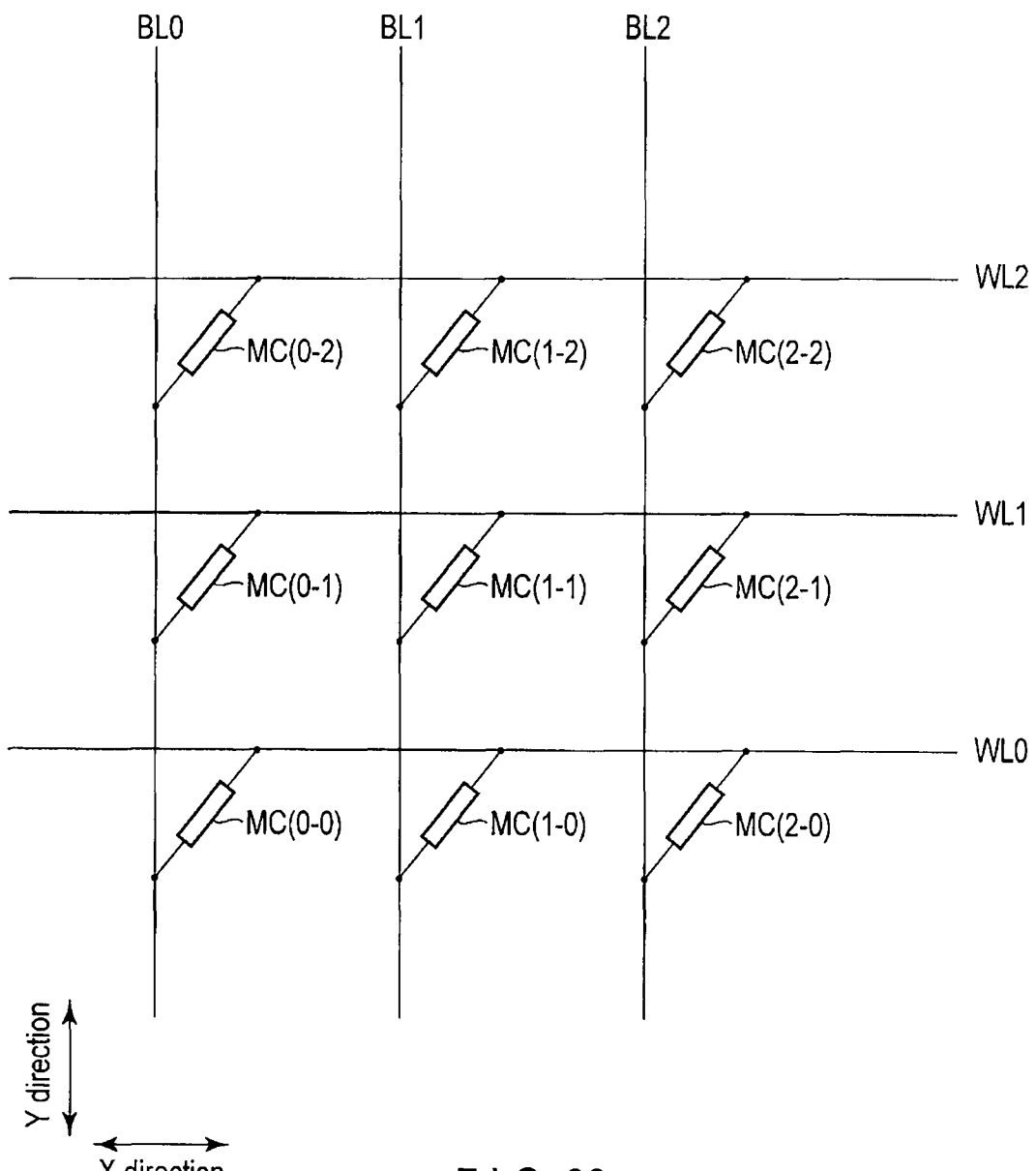
F I G. 22

MEMORY DEVICE

CROSS-REFERENCE TO RELATED APPLICATIONS

This application is based upon and claims the benefit of priority from prior Japanese Patent Application No. 2011-215016, filed Sep. 29, 2011, the entire contents of which are incorporated herein by reference.

FIELD

Embodiments described herein relate generally to a memory device, for example, a memory device which includes a memory element of two terminals that is arranged in a memory cell array of a cross-point type.

BACKGROUND

Memory devices of two terminals in prior art have the following structure. A tunnel insulating film which is formed of a silicon oxide film is disposed on an interconnection that is formed of a conductor or an n-type (p-type) semiconductor. Silicon nanocrystals (silicon minute particles) which satisfy a Coulomb blockade condition (charging energy of an electron is larger than heat fluctuation) are formed on the tunnel insulating film such that the nanocrystals are spaced from each other.

A tunnel insulating film which is formed of a silicon oxide film is formed on a surface of the nanocrystals, and a silicon nitride film that has a silicon-rich composition is formed on the tunnel insulating film. In addition, an upper interconnection which is formed of a conductor or an n-type (p-type) semiconductor is formed on the silicon nitride film.

In the memory device structure described above, a current can flow between the surfaces of the interconnections by trap conduction in the silicon nitride film which includes a number of trap levels. Since the current increases and decreases according to presence/absence of trapped electrons in traps, the memory device can operate as a memory by reading the current between electrodes, using electrons which are trapped in traps located in the vicinity of a silicon nanocrystal that satisfies the Coulomb blockade condition, as information electric charges.

In the memory device described above, however, the current value between the interconnection electrodes, and leakage of the information electric charges trapped in traps in the vicinity of the silicon nanocrystal depend on trap conduction in the silicon nitride film (trap insulating film), and thus any memory characteristics depend on the trap state in the insulating film, which is difficult to control.

BRIEF DESCRIPTION OF THE DRAWINGS

FIG. 11 is a diagram illustrating an energy structure for explaining problems with securing maintaining time in the first and second embodiments.

FIG. 12 is a cross-sectional view of a structure of a memory device according to a third embodiment.

FIG. 15 is a diagram illustrating an energy structure in the memory device of the third embodiment when erasing is performed.

FIG. 19 is a cross-sectional view illustrating a structure of a memory device according to a fifth embodiment.

FIG. 20 is a cross-sectional view illustrating a structure of a memory device according to a sixth embodiment.

FIG. 21 is a cross-sectional view illustrating a structure of a memory device according to a seventh embodiment.

FIG. 22 is a circuit diagram illustrating a structure of a cross-point memory according to an eighth embodiment.

DETAILED DESCRIPTION

Figure 1:
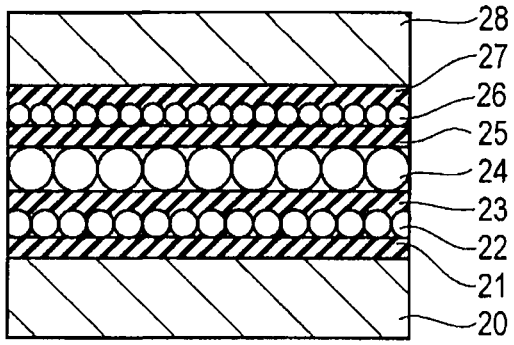
FIG. 1 is a cross-sectional view of a structure of a memory device according to a first embodiment.

Embodiments will be explained hereinafter with reference to drawings. In the following explanation, constituent elements which have the same function and structure are denoted by the same reference numeral, and overlapping explanation will be made only when necessary.

In general, according to one embodiment, a memory device includes first and second double tunnel junction structures, a charge storage layer and first and second conductive layers. The first double tunnel junction structure includes a first nanocrystal layer that includes first conductive minute particles being nanocrystals, and first and second tunnel insulating films that are arranged to sandwich the first nanocrystal layer. The second double tunnel junction structure includes a second nanocrystal layer that includes second conductive minute particles being nanocrystals, and third and fourth tunnel insulating films that are arranged to sandwich the second nanocrystal layer. The charge storage layer is arranged between the first and second double tunnel junction structures, and stores information charges. The first and second conductive layers are arranged to sandwich the first double tunnel junction structure, the charge storage layer, and the second double tunnel junction structure. The first conductive minute particles has an average grain size which is different from an average grain size of the second conductive minute particles.

[First Embodiment]

First, a memory device of a first embodiment will be explained hereinafter.

[1] Structure of Memory Device

FIG. 1 is a cross-sectional view of a structure of the memory device according to the first embodiment.

As illustrated, a tunnel insulating film having a thickness of about 1 nm, for example, a silicon oxide film 21 is formed on a first conductive layer, for example, an n+ polysilicon interconnection (electrode) 20 which includes phosphorous impurities of high concentration. A nanocrystal layer 22 which includes conductive minute particles such as silicon nanocrystals (silicon minute particles) is formed on the silicon oxide film 21. In addition, a tunnel insulating film having a thickness of about 1 nm, for example, a silicon oxide film 23 is formed on the nanocrystal layer 22. The nanocrystal layer 22 is interposed between the silicon oxide film 21 and the silicon oxide film 23. The silicon oxide film 21, the nanocrystal layer 22, and the silicon oxide film 23 which are superposed form a first double tunnel junction structure.

A charge storage layer which stores information charges is formed on the silicon oxide film 23. In this example, a nanocrystal layer 24 which includes conductive minute particles such as silicon nanocrystals (silicon minute particles) is formed as the charge storage layer.

A tunnel insulating film which has a thickness of about 1 nm, for example, a silicon oxide film 25 is formed on the nanocrystal layer 24. A nanocrystal layer 26 which includes conductive minute particles such as silicon nanocrystal (silicon minute particles) is formed on the silicon oxide film 25. In addition, a tunnel insulating film which has a thickness of about 1 nm, for example, a silicon oxide film 27 is formed on the nanocrystal layer 26. The nanocrystal layer 26 is interposed between the silicon oxide film 25 and the silicon oxide film 27. The silicon oxide film 25, the nanocrystal layer 26, and the silicon oxide film 27 which are superposed form a second double tunnel junction structure.

Besides, a second conductive layer, for example, an n+ polysilicon interconnection (or electrode) 28 which includes phosphoruous impurities of high concentration is formed on the silicon oxide film 27.

In the memory device having the above structure, an average grain size of the conductive minute particles which are included in the nanocrystal layer 22 is different from an average size of the conductive minute particles included in the nanocrystal layer 26. For example, the average grain size of the conductive minute particles of the nanocrystal layer 22 is larger than the average grain size of the conductive minute particles of the nanocrystal layer 26. In addition, an average grain size of the conductive minute particles included in the nanocrystal layer 24 is larger than the average grain sizes of the conductive minute particles of the nanocrystal layers 22 and 26.

[2] Manufacturing Method of Memory Device

Next, a method of manufacturing the memory device of the first embodiment will be explained hereinafter.

FIG. 2A, FIG. 2B, FIG. 3A, FIG. 3B, FIG. 4A, and FIG. 4B are cross-sectional views which illustrate the method of manufacturing the memory device of the first embodiment.

Figure 2A:
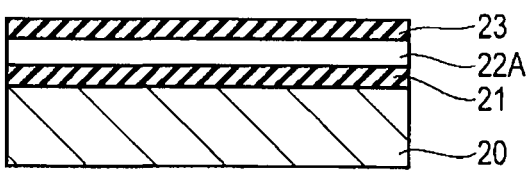

As illustrated in FIG. 2A, a silicon oxide film 21 which has a thickness of about 1 nm is formed by rapid thermal oxidation (RTO) on an n+ polysilicon interconnection 20 that includes phosphorous impurities of high concentration. Then, an amorphous silicon (a-Si) film 22A having a thickness of about 2.5 nm is deposited on the silicon oxide film 21 by CVD. Next, a silicon oxide film 23 having a thickness of about 1 nm is formed on a surface of the a-Si film 22A by thermal oxidation. Thereby, the a-Si film 22A has a thickness of about 2 nm, and the a-Si film 22A is interposed between the silicon oxide films 21 and 23, each of which has a thickness of about 1 nm, from above and below.

Figure 2B:
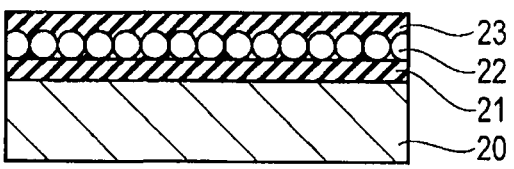

Next, the structure is subjected to high-temperature annealing at 900° C. in a nitrogen atmosphere. Thereby, as illustrated in FIG. 2B, the a-Si film 22A is changed to a nanocrystal layer 22 which includes silicon minute crystals, each of which has a size of about 2 nm that is equal to the thickness of the a-Si film.

Figure 3A:
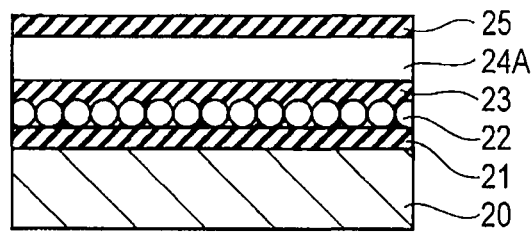
FIGS. 2A, 2B, 3A, 3B, 4A and 4B are cross-sectional views illustrating a manufacturing method of the memory device of the first embodiment.

Next, as illustrated in FIG. 3A, an amorphous silicon film 24A having a thickness of about 3.5 nm is deposited on the silicon oxide film 23 by CVD. Then, a silicon oxide film 25 which has a thickness of about 1 nm is formed on a surface of the a-Si film 24A by thermal oxidation. Thereby, the a-Si film 24A has a thickness of about 3 nm, and the a-Si film 24A is interposed between the silicon oxide films 23 and 25, each of which has a thickness of about 1 nm, from above and below.

Figure 3B:
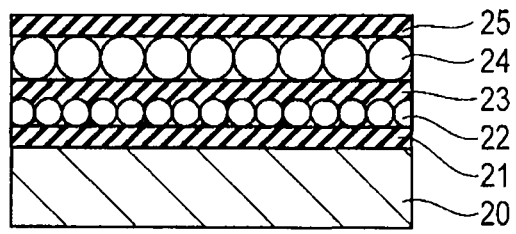

Next, the structure is subjected to high-temperature annealing at 900° C. in a nitrogen atmosphere. Thereby, as illustrated in FIG. 3B, the a-Si film 24A on the silicon oxide film 23 is changed to a nanocrystal layer 24 which includes silicon minute crystals, each of which has a size of about 3 nm that is equal to the thickness of the a-Si film.

Figure 4A:
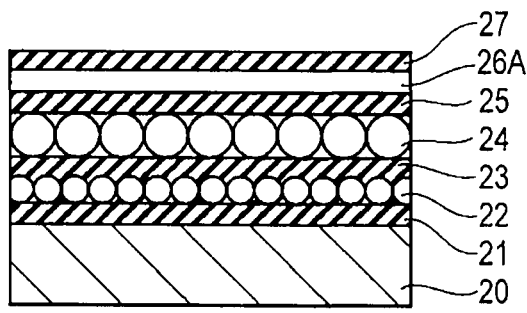

Next, as illustrated in FIG. 4A, an amorphous silicon film 26A having a thickness of about 1.5 nm is deposited on the silicon oxide film 25 by CVD. Then, a silicon oxide film 27 which has a thickness of about 1 nm is formed on a surface of the a-Si film 26A by thermal oxidation. Thereby, the a-Si film 26A on the silicon oxide film 25 has a thickness of about 1 nm, and the a-Si film 26A is interposed between the silicon oxide films 25 and 27, each of which has a thickness of about 1 nm, from above and below.

Figure 4B:
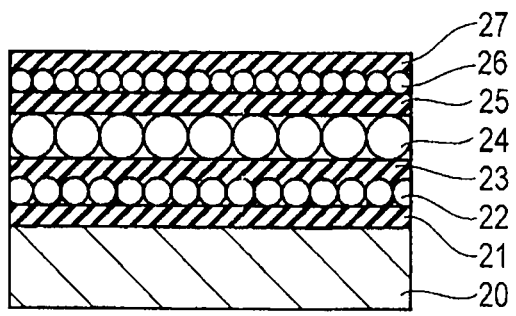

Next, the structure is subjected to high-temperature annealing at 950° C. in a nitrogen atmosphere. Thereby, as illustrated in FIG. 4B, the a-Si film 26A on the silicon oxide film 25 is changed to a nanocrystal layer 26 which includes silicon minute crystals, each of which has a size of about 1 nm that is equal to the thickness of the a-Si film.

Thereafter, as illustrated in FIG. 1, an n+ polysilicon layer 28 which includes phosphorous impurities is formed on the silicon oxide film 27 by LPCVD. By the above process, the memory device of the first embodiment as illustrated in FIG. 1 is manufactured.

As described above, the whole memory device of the first embodiment is formed of a Si-based material which matches the LSI process, that is, the whole memory device can be formed of a silicon-based material. Therefore, the method of manufacturing the memory device highly matches the silicon LSI process.

In addition, in the above process, after silicon nanocrystals (silicon minute particles) having a size equal to the thickness of the a-Si film are formed, horizontal crystal growth hardly occurs in a thin Si nano thickness, since the silicon nanocrystals tend to maintain a crystal state in which the surface energy of the silicon nanocrystal is minimum. Therefore, by controlling the nitrogen annealing condition, the grain size of Si nanocrystals which have a typical size equal to the thickness of the film can be controlled when the nanocrystal layers 22, 24, and 26 are formed. Although annealing for formation of silicon nanocrystals is performed for each silicon nanocrystal layer in the above example, annealing may be performed for all the silicon nanocrystal layers together.

Since the typical size of the Si nanocrystals depends on the film thickness, a typical size of the silicon nanocrystals of the lower nanocrystal layer 22 is 2 nm, a typical size of the silicon nanocrystals of the center nanocrystal layer 24 is 3 nm, and a typical size of the silicon nanocrystals of the upper nanocrystal layer 26 is 1 nm.

[3] Operation of the Memory Device

In the first embodiment, the silicon nanocrystals (silicon minute particles) have a small grain size of 3 nm or less, and thus satisfy the Coulomb blockade condition that the charging energy of an electron is sufficiently larger than thermal fluctuation.

Therefore, when one electron is charged in a silicon minute particle, a high energy state is formed in the silicon minute particle by the Coulomb blockade effect and the quantum-confined effect, and an energy barrier is generated when another electron passes through the silicon minute particle.

Figure 5:
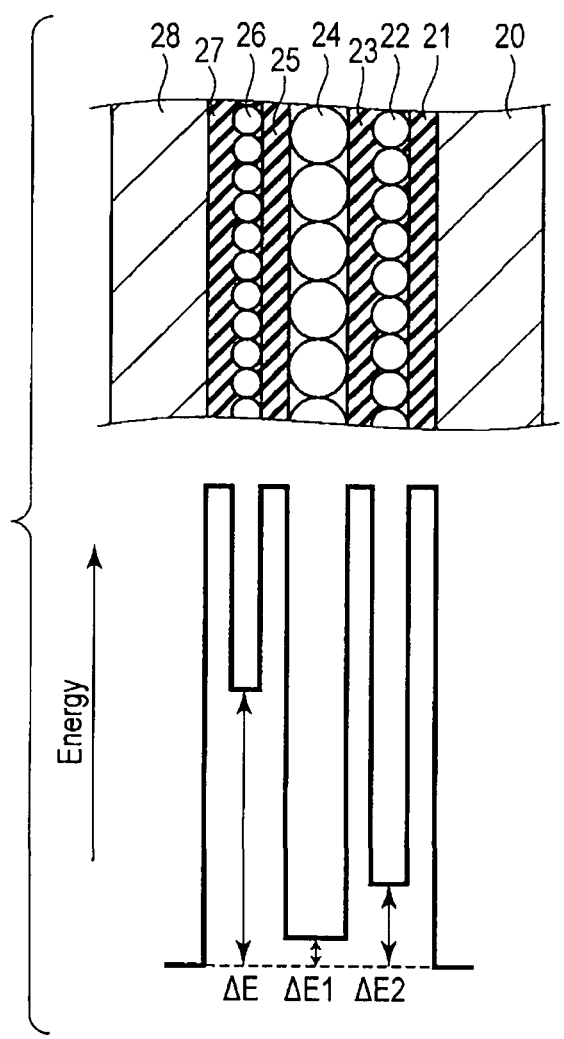
FIG. 5 is a diagram illustrating an energy structure in the memory device of the first embodiment.

FIG. 5 is a diagram illustrating an energy structure in the memory device of the first embodiment.

An energy barrier which is caused by the Coulomb blockade effect and the quantum-confined effect in the silicon nanocrystals exists between the tunnel barriers by the tunnel insulating films in the memory device. The size of an energy barrier increases as the grain size of the silicon nanocrystals decreases. Therefore, an energy barrier $\Delta E1$ of the center nanocrystal layer 24 is lowest, and an energy barrier $\Delta E2$ of the lower nanocrystal layer 22 is higher than $\Delta E1$. In addition, an energy barrier $\Delta E$ of the upper nanocrystal layer 26 is higher than $\Delta E1$ and $\Delta E2$, and highest of them.

The energy barriers caused by the Coulomb blockade effect and the quantum-confined effect are energy regions which cannot be entered including tunnel leakage, and thus electrons have to exceed the energy barrier to pass through the energy region. Therefore, the memory device of the present embodiment can realize good memory operation.

As described above, conductive minute particles which satisfy the Coulomb blockade condition and two tunnel junctions which sandwich the conductive minute particles are referred to as double tunnel junction in the field of dealing with a single-electron tunneling.

In the memory operation in the first embodiment can be performed by storing information charges in the nanocrystal layer 24 which is located in the center and has the largest grain size. The following is explanation of writing, erasing, and reading operations in the first embodiment.

First, writing in the memory device of the first embodiment will be explained hereinafter.

Figure 6:
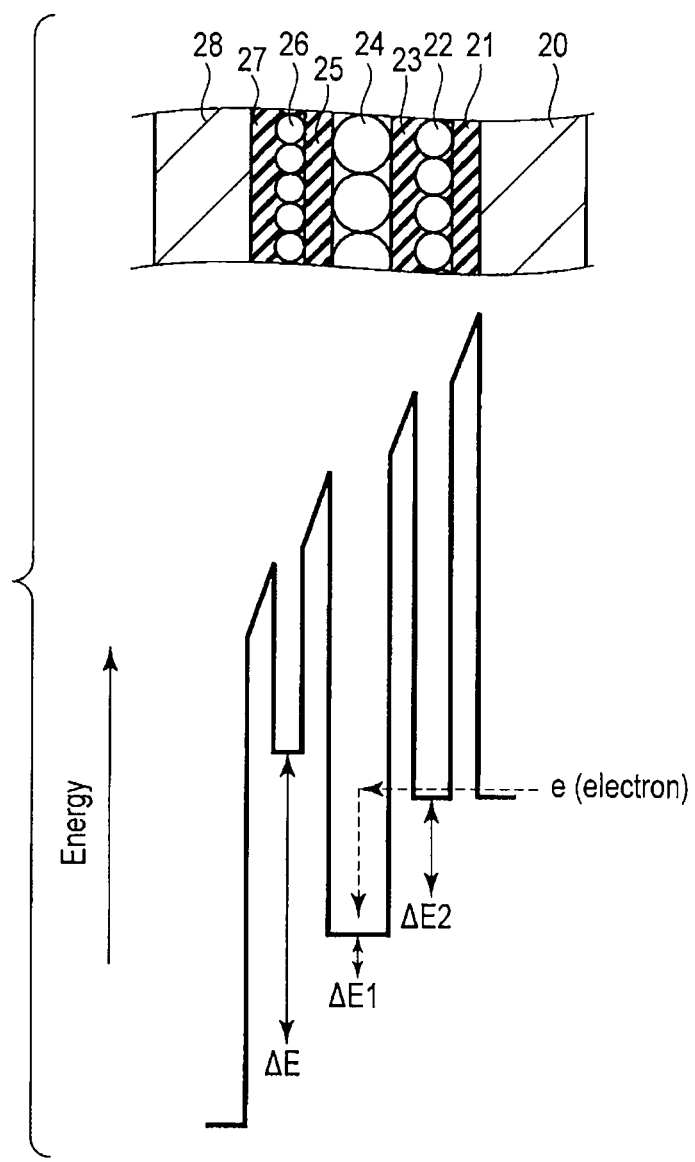
FIG. 6 is a diagram illustrating an energy structure in the memory device of the first embodiment when writing is performed.

FIG. 6 is a diagram illustrating an energy structure in writing in the memory device of the first embodiment.

When information charges are written in the nanocrystal layer 24, a proper plus voltage is applied to the upper interconnection 28. As illustrated in FIG. 6, a proper plus voltage should be applied to the upper interconnection 28, such that the energy barrier $\Delta E2$ of the lower nanocrystal layer 22 is removed, to let electrons in the lower interconnection 20 go into the energy barrier $\Delta E1$ of the center nanocrystal layer 24. In this operation, it is desirable that the energy barrier $\Delta E$ of the upper nanocrystal layer 26 is sufficiently high and shuts off a piercing current which goes from the lower interconnection 20 toward the upper interconnection 28, from the viewpoint of high writing efficiency and lower power consumption.

As illustrated in FIG. 6, it is desirable that "$\Delta E > 3 \times \Delta E2$" is satisfied such that the energy barrier $\Delta E$ blocks a piercing current in writing. In the present embodiment, since the silicon oxide films (tunnel insulating films) 21, 23 and 25 have the equal thickness of 1 nm, the same potential difference is applied to the silicon oxide films 21, 23 and 25 when writing is started. Therefore, when a potential difference of $\Delta E2$ is applied to the silicon oxide film 21 to remove the energy barrier $\Delta E2$, the same potential difference of $\Delta E2$ is also applied to the silicon oxide films 23 and 25, and all the silicon oxide films 21, 23 and 25 are provided with a potential difference of "$3 \times \Delta E2$". Therefore, it is possible to block a piercing current between the interconnections 20 and 28 in writing, when "$\Delta E > 3 \times \Delta E2$" is satisfied.

Generally, when the silicon oxide films 21, 23 and 25 do not have the same thickness, the same electric field is applied to them when writing is started, and thus a potential difference which is proportional to the thickness is applied to each silicon oxide film. Therefore, supposing that the silicon oxide films 21, 23 and 25 have thicknesses of T21, T23, and T25, respectively, a piercing current between the interconnections 20 and 28 can be blocked when "$\Delta E > [(T21+T23+T25)/T21] \times \Delta E2$" is satisfied.

The energy barrier is caused by the quantum confinement effect and the Coulomb blockade effect in the silicon nanocrystals. With respect to the size (diameter) d of the silicon nanocrystals (silicon minute particles), an energy of quantum confinement is proportional to $d^{-2}$, a Coulomb blockade energy is proportional to $d^{-1}$, that is, they increase as the silicon nanocrystals are miniaturized. By using this, it is possible to estimate desirable conditions for a size d of the silicon nanocrystals to block a piercing current between interconnections in writing.

Since the quantum confinement effect proportional to $d^{-2}$ becomes conspicuous than the Coulomb blockade effect as the size d of the silicon nanocrystals decreases, a desirable condition is "$d^{-2} > [T21+T23+T25]/T21] \times d_2^{-2}$", that is, "$d_2 > [(T21+T23+T25)/T21]^{1/2} d$", when the diameter of the silicon nanocrystals in the nanocrystal layer 26 is d and the diameter of the silicon nanocrystals in the nanocrystal layer 22 is $d_2$. When the silicon oxide films 21, 23 and 25 have the same thickness as in the first embodiment, the desirable condition is "$d_2 > 3^{1/2} d$". Since "$d_2 = 2d > 3^{1/2} d$" is satisfied in the first embodiment, it is expected to block a piercing current between interconnections in writing. Since the diameter d of the silicon nanocrystals in the nanocrystal layer 26 is 1 nm and the diameter $d_2$ of the silicon nanocrystals in the nanocrystal layer 22 is 2 nm, the condition "$d_2 > 3^{1/2} d$" is satisfied.

In addition, as a desirable condition, when a condition "$d^{-1} > [(T21+T23+T25)/T21] d_2^{-1}$", that is, "$d_2 > [(T21+T23+T25)/T21] d$" is also satisfied, it is expected to more securely block a piercing current between the interconnections 21 and 28 in writing.

Next, erasing in the memory device of the first embodiment will be explained hereinafter.

Figure 7:
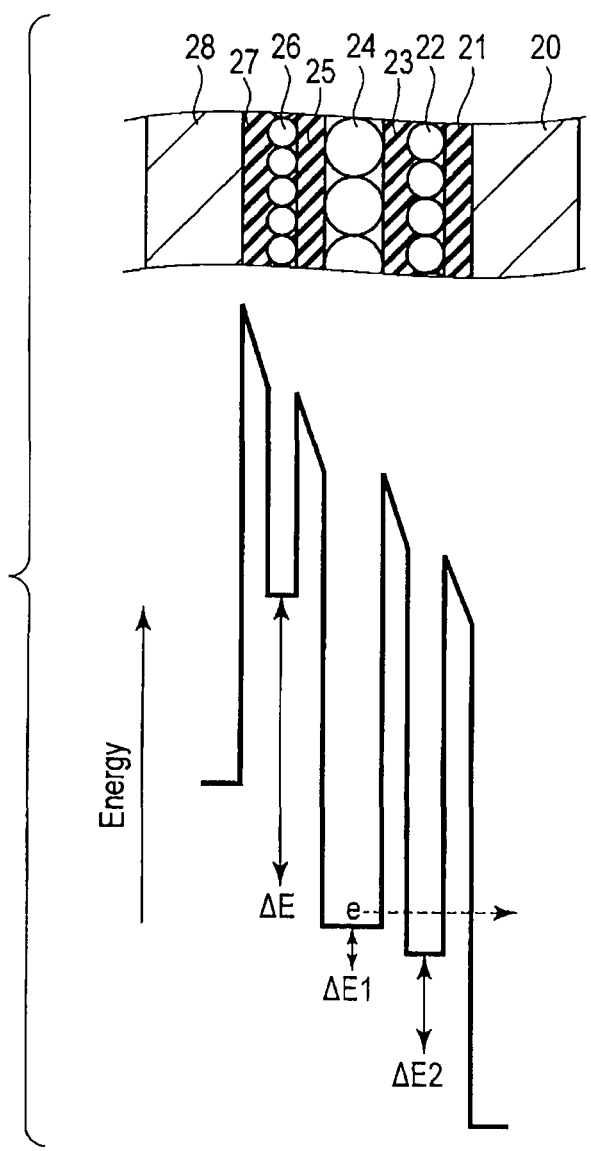
FIG. 7 is a diagram illustrating an energy structure in the memory device of the first embodiment when erasing is performed.

FIG. 7 is a diagram illustrating an energy structure in erasing in the memory device of the first embodiment.

To erase information charges written in the nanocrystal layer 24, a proper plus voltage should be applied to the lower interconnection 20. Erasing can be performed by let the information charges in the nanocrystal layer 24 go into the lower interconnection 20 without being blocked by the energy barrier $\Delta E2$ of the nanocrystal layer 22. A erasing voltage should be applied between the interconnections 20 and 28 such that a potential difference of "$\Delta E2 - \Delta E1$" or more is applied to the silicon oxide film 23.

When a plus voltage is applied to the lower interconnection 20, since the highest energy barrier $\Delta E$ exists in the vicinity of the upper interconnection 28, a piercing current between the interconnections 20 and 28 is blocked. The memory device of the present embodiment is an advantageous memory device which can realize not only increase in erasing efficiency in erasing and lower power consumption but also high rectification performance, which is frequently necessary in memory cell array operation, by device structure design.

Next, reading in the memory device of the first embodiment will be explained hereinafter.

Figures 8A, 8B:
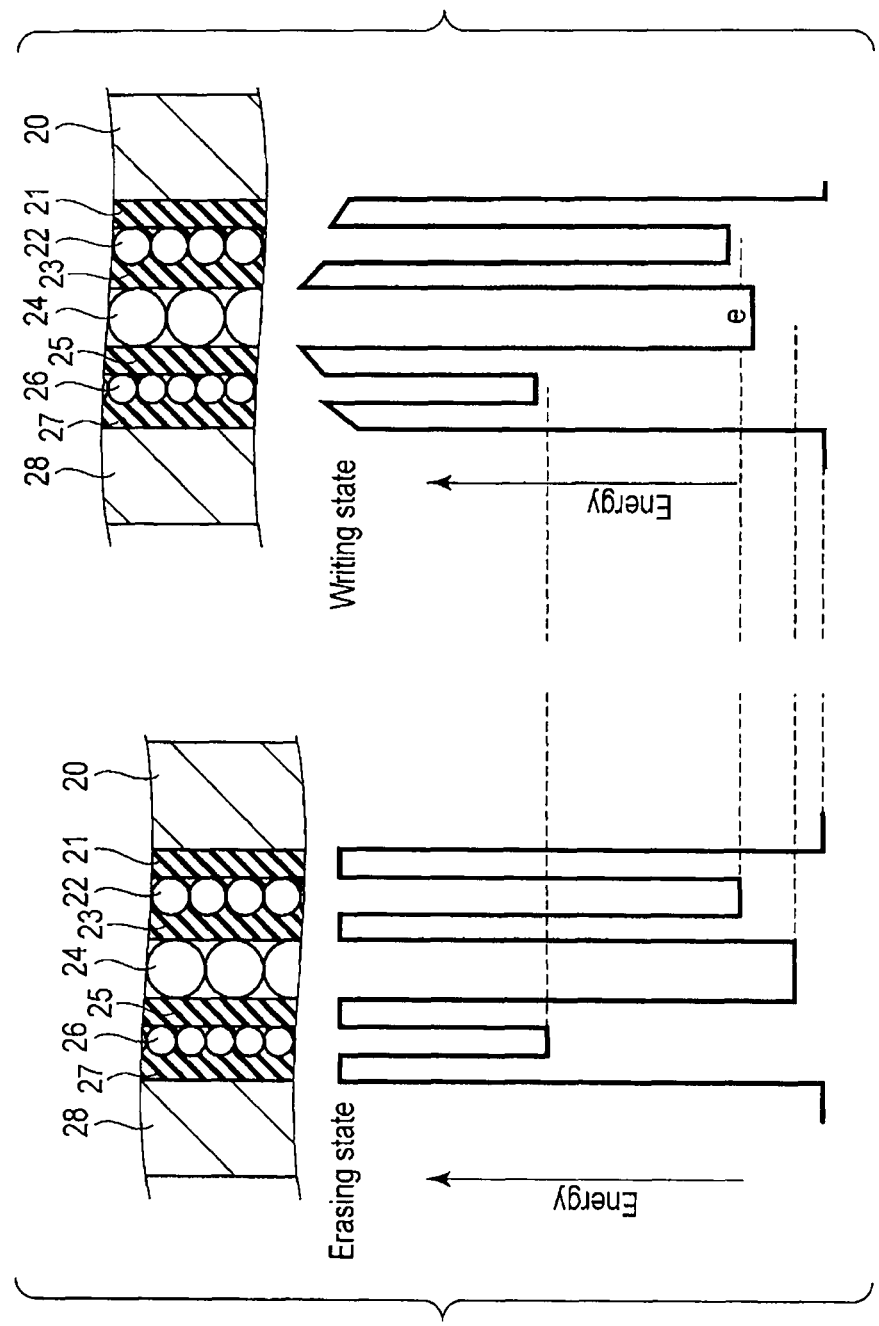
FIGS. 8A and 8B are diagrams illustrating energy structures in the memory device of the first embodiment in a written state and an erased state.

FIG. 8A and FIG. 8B are diagrams illustrating energy structures under conditions for maintaining a written state/erased state in the memory device of the first embodiment.

In the written state illustrated in FIG. 8B, although energies of the energy barriers $\Delta E$ and $\Delta E2$ are the same as those in the erased state illustrated in FIG. 8A, the energy barriers $\Delta E$ and $\Delta E2$ rise up to be higher than those in the erased state, by the electrostatic energy of the information electrons of $\Delta E1$.

Retaining the written state/erased state is performed by suppressing a leak current by the energy barriers of the nanocrystal layers 26 and 22. A method of realizing a longer retention time is to increasing the absolute value of the energy barrier $\Delta E2$ while the condition "66 E>[(T21+T23+T25)/T21]×$\Delta E2$" for suppressing a piercing current in writing is maintained. Thereby, it is possible to improve the storage maintaining function in an exponential manner. Specifically, when the grain sizes of the minute particles in the nanocrystal layer 26 and the nanocrystal layer 22 are decreased while satisfying the condition "$\Delta E$>[(T21+T23+T25)/T21]×$\Delta E2$", the retention time can be increased.

Figure 9A:
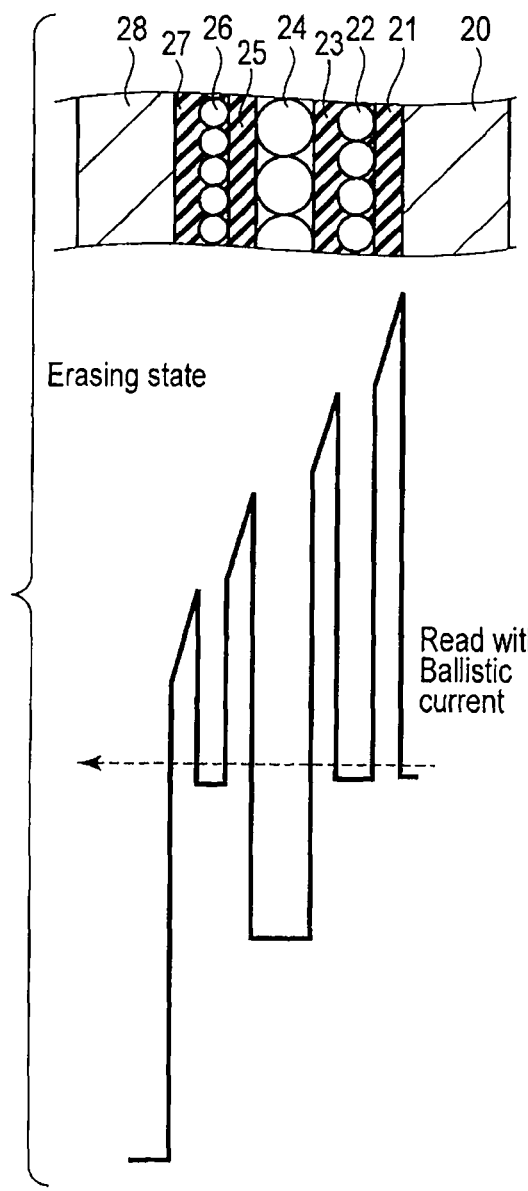
FIGS. 9A and 9B are diagrams illustrating energy structures in the memory device of the first embodiment in a reading state.
Figure 9B:
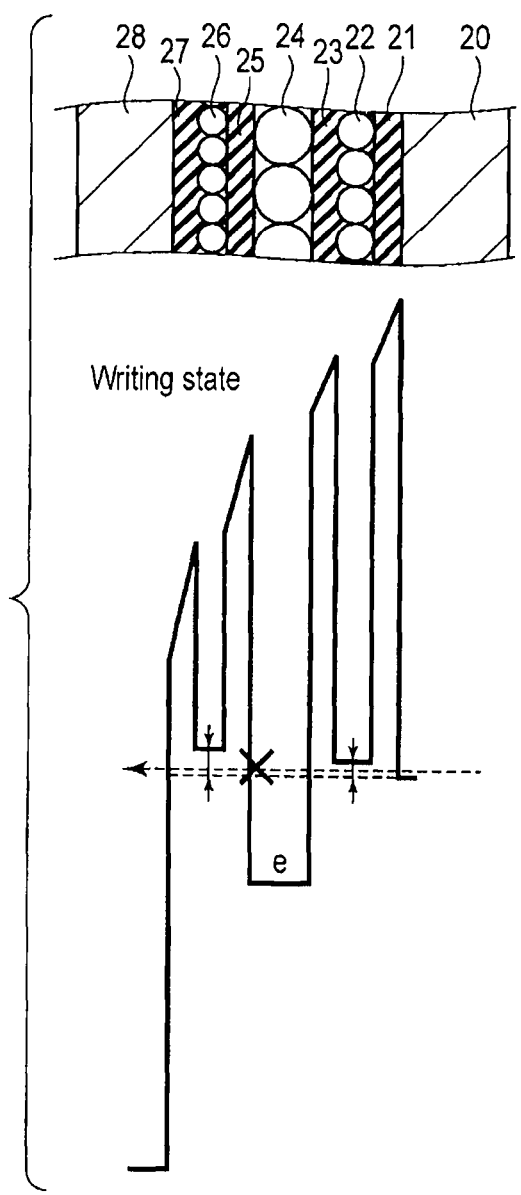

FIG. 9A and FIG. 9B are diagrams illustrating energy structures when a reading voltage is applied to the interconnection 28 in the first embodiment.

Information reading can be performed by reading a difference in piercing current from the lower interconnection 20 to the upper interconnection 28.

As illustrated in FIG. 9A, in an erased state in which no information charge exists in the nanocrystal layer 24, there is no energy barrier which blocks the piercing current, the electrons go from the lower interconnection 20 into the upper interconnection 28 in a ballistic manner. It is desirable that an on current is efficiently obtained, the nanocrystal layer 24 is sufficiently thin, and ballistic electrons pass through the nanocrystal layer 24 before energy relaxation, from the viewpoint of preventing erroneous writing. It is known that silicon films having a thickness of 5 nm or less have a large effect of letting ballistic electrons pass through the silicon films without energy relaxation. Therefore, the nanocrystal layer 24 preferably has a silicon film thickness (grain size of the silicon minute particles) of 5 nm or less.

In addition, in the memory device structure and the reading method of the present embodiment, the silicon oxide films 25 and 27 have a thin thickness of about 1 nm, and the tunnel barriers of the silicon oxide films 25 and 27 are low for ballistic electrons from the lower interconnection 20. Therefore, the memory device structure and the reading method of the present embodiment are convenient from the viewpoint of efficiently obtaining an on current and preventing erroneous writing.

On the other hand, as illustrated in FIG. 9B, when the memory device is in the written state, that is, in the written state in which information charges exist in the nanocrystal layer 24, the potential of the nanocrystal layer 24 is increased by the information charges, and thus ballistic electrons can be blocked by the energy barrier. Thereby, it is possible to decrease the reading current value. In statistical mechanics, a current value efficiently decreases in an exponential manner (decreases by one digit for an energy barrier of 60 meV) for a blocking energy barrier, and thus an on/off ratio of the reading current which corresponds to the writing state and the erasing state can be efficiently increased.

In the memory device of the first embodiment, any operation of writing, erasing, retention, and reading can be performed by applying a proper voltage, and the piercing current value, a leak current value of the information charges, and a proper application voltage value in each state can be theoretically estimated based on the tunnel resistance values and the heights of the energy barriers of the silicon oxide films (tunnel insulating films). Orthodox theory is well known as a theory of a current/voltage characteristics in the case where fine conductive minute particles satisfy the Coulomb blockade condition.

In the first embodiment, since the nanocrystal layer 24 serving as a charge storage module is also formed of Si nanocrystals, there is the advantage that the information charge quantity can be controlled by designing the grain size of the nanocrystal layer 24, by using the Coulomb blockade effect and the quantum confinement effect of the nanocrystal layer 24 itself.

As described above, according to the first embodiment, the whole memory device can be formed of a silicon-based material, and thus highly conforms to the silicon LSI process. In addition, since memory operation can be performed with a Si nanoparticle in principle, the memory device can be miniaturized to a very small size which is equal to about the grain size of a nanoparticle of a cell area. Each operation voltage value and a current value in each state can be controlled and designed based on the tunnel resistance and the energy barrier, which basically depend on the structure factors of the thickness of the tunnel oxide films and the grain size of the silicon nanocrystals. Therefore, according to the memory device of the first embodiment, the memory characteristics and the operation can be designed by designing the device structure, that is, designing the tunnel insulating films and the minute particles (nanocrystals) which form the memory device.

[Second Embodiment]

Although n+ polysilicon is used as the material of the upper and lower interconnections 20 and 28 in the first embodiment, another conductive material (such as metal or semi-conductor) may be used. In particular, it is desirable to use metal as the material of the interconnections 20 and 28, from the viewpoint of reduction in resistance. In the case of using metal, since a work function of metal is larger than electron affinity of silicon, the energy position of an electron from the interconnection changes. The second embodiment shows an example in which the upper and lower interconnections are formed of metal.

Figures 10A, 10B:
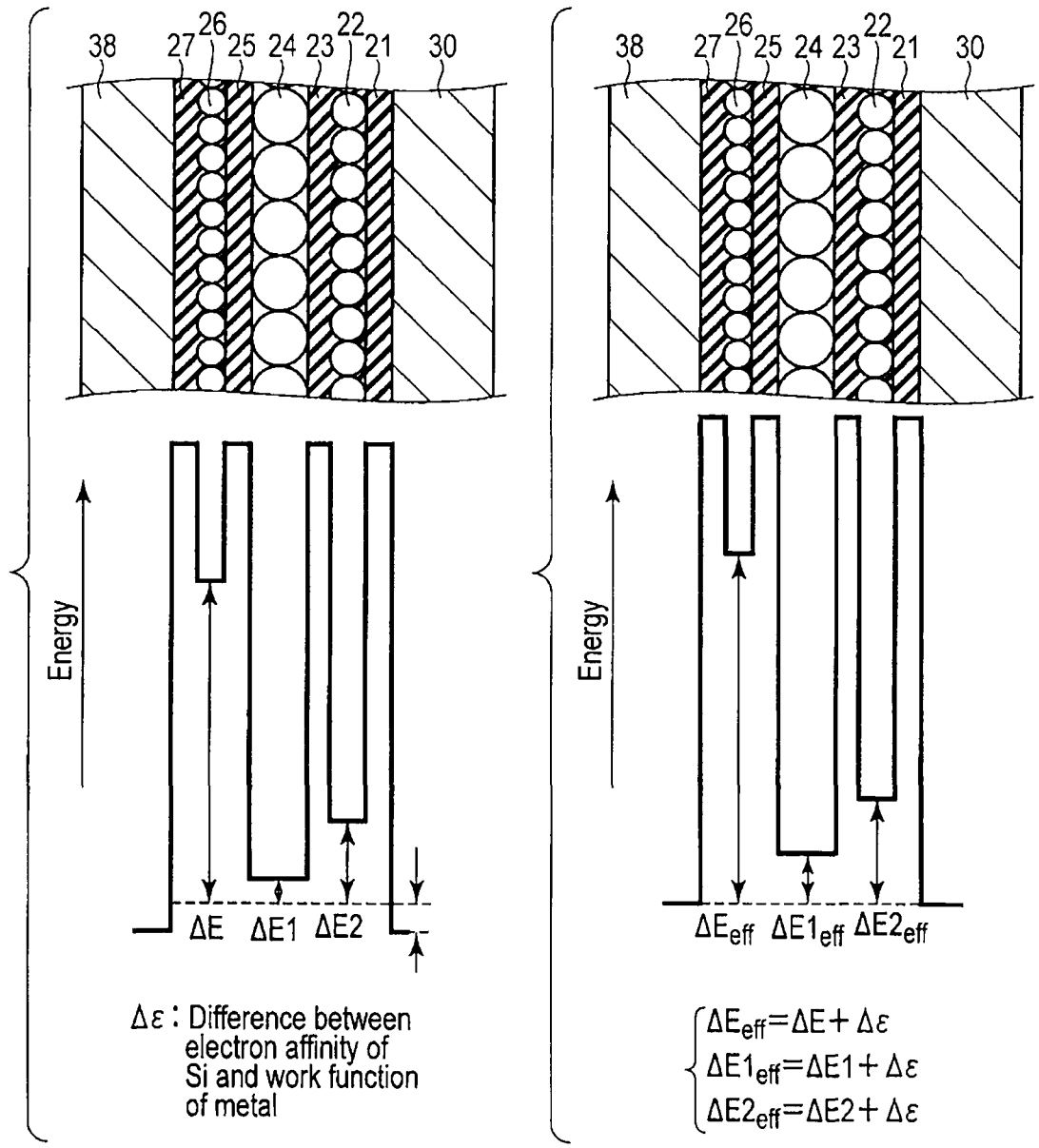
FIGS. 10A and 10B are diagrams illustrating a structure and an energy structure of a memory device according to a second embodiment.

FIG. 10A and FIG. 10B are diagrams illustrating a cross-sectional structure and energy structures of a memory device according to the second embodiment.

Upper and lower interconnections 30 and 38 are formed of metal material. Examples of the metal material used for the interconnections 30 and 38 are W (tungsten), WN (tungsten nitride), TaN (tantalum nitride), WSi (tungsten silicide), CoSi (cobalt silicide), and NiSi (nickel silicide).

The memory device of the second embodiment can be formed in the same manner as the first embodiment, except for the following process. Although the silicon oxide film 21 in the first embodiment is formed by subjecting the surface of the polysilicon interconnection 20 to thermal oxidation, a silicon oxide film 21 of the second embodiment in which the interconnection material is not silicon is formed by CVD such as atomic layer deposition (ALD).

In addition, although the silicon nanocrystal layers 22, 24 and 26 in the first embodiment are formed by using a heating process in a nitrogen atmosphere, the second embodiment, in which metal that is the material of the interconnection 30 has low melting point and it may be difficult to heat the whole system at high temperature, adopts a method of controlling the grain size of silicon nanocrystals by performing heating at low temperature for long time, or a method of controlling the grain size of the silicon nanocrystals by local heating by laser annealing. Thereby, it is possible to suppress influence on the interconnections even when the metal which forms the interconnections has low melting point.

As illustrated in FIG. 10A, it is necessary in the second embodiment to consider a difference $\Delta c$ between the electron affinity of Si and the work function of the metal. As illustrated in FIG. 10B, suppose that "$\Delta E_{\mathit{eff}} = \Delta E + \Delta \epsilon$, $\Delta E1_{\mathit{eff}} = \Delta E1 + \Delta \epsilon$, $\Delta E2_{\mathit{eff}} = \Delta E2 + \Delta \epsilon$" are satisfied. The state is equal to the state of FIG. 5, in which $\Delta E$ is replaced by $\Delta E_{\mathit{eff}}$, $\Delta E1$ is replaced by $\Delta E1_{\mathit{eff}}$, and $\Delta E2$ is replaced by $\Delta E2_{\mathit{eff}}$. Specifically, the same effect can be obtained by the same theory as the first embodiment, by replacing the energy barriers obtained by the quantum confinement effect and the Coulomb blockade effect in the silicon nanocrystals by effective energy barriers determined in consideration of a difference between the electron affinity of silicon and a work function of the metal.

Therefore, the second embodiment can perform all the operations of writing, erasing, maintaining, and reading by applying a proper voltage, as explained in FIG. 6, FIG. 7, FIG. 8A, FIG. 8B, FIG. 9A, and FIG. 9B. The piercing current value, the leak current value of information charges, and the proper application voltage value in each state can be theoretically expected based on the tunnel resistance values of the silicon oxide film (tunnel insulating films) and the height of the effective energy barriers determined in consideration of the difference in the electron affinity of silicon and the work function of the metal. Thereby, it is possible to design the memory characteristics by designing the structures, that is, the thicknesses of the silicon oxide films and the grain sizes of the silicon nanocrystals (silicon minute particles).

[Third Embodiment]

In the first embodiment, it is desirable to satisfy the relation "$\Delta E > 3 \times \Delta E2$" to suppress a piercing current in writing. Therefore, since the energy barrier $\Delta E2$ has to be comparatively lower than the barrier $\Delta E$, there are cases where a leak between the lower interconnection 20 and the nanocrystal layer 24 which is a storage module of information charges cannot be sufficiently suppressed as illustrated in FIG. 11, and storage cannot be sufficiently maintained. To solve the problem, there is a method of increasing $\Delta E2$ while the relation "$\Delta E > 3 \times \Delta E2$" is satisfied. In this case, however, it is necessary to remarkably increase $\Delta E$, and it is required to control the grain size of the minute particles included in the nanocrystal layer 26 to a very small size, which is difficult to control. Therefore, the third embodiment proposes a structure which eases the condition "$\Delta E > 3 \times \Delta E2$" for suppressing the piercing current in writing.

FIG. 12 is a cross-sectional view illustrating a structure of a memory device according to the third embodiment.

As illustrated in FIG. 12, the memory device has a structure in which an auxiliary structure part is added to the structure (memory basic structure part) of the first embodiment including the silicon oxide film 21, the nanocrystal layer 22, . . . , silicon oxide film 27.

The auxiliary structure part is arranged between a interconnection 20 and a silicon oxide film 21, and includes a silicon oxide film 31, a nanocrystal layer 32, a silicon oxide film 33, and a nanocrystal layer 34. More specifically, the nanocrystal layers 32 and 34 which include minute particles of grain sizes larger than that of minute particles in a nanocrystal layer 22 are formed between the lower interconnection 20 and the silicon oxide film 21. The minute particles in the nanocrystal layers 32 and 34 are formed of, for example, silicon. Among the nanocrystal layers 32 and 34, the minute particles in the nanocrystal layer which is closer to the interconnection 20 has a larger grain size, that is, the grain size of the nanocrystal layer 32 which is closer to the interconnection 20 is larger than the grain size of the nanocrystal layer 34. In addition, the silicon oxide film 31 is formed between the interconnection 20 and the nanocrystal layer 32, and the silicon oxide film 33 is formed between the nanocrystal layer 32 and the nanocrystal layer 34. The silicon oxide films 31 and 33 are formed with a thickness of, for example, about 1 nm, which is equal to the thickness of the silicon oxide films 21, 23, 25 and 27.

Although the third embodiment shows an example of two nanocrystal layers 32 and 34 are formed in the auxiliary structure part, it suffices that at least one nanocrystal layer is formed. When there are a plurality of nanocrystal layers, a nanocrystal layer which is closer to the interconnection 20 has a larger grain size, and the nanocrystal layer closest to the interconnection 20 has the largest grain size.

The following is explanation of the reason why the condition "$\Delta E > 3 \times \Delta E2$" for suppressing the piercing current in writing is eased in the third embodiment illustrated in FIG. 12.

Figure 13:
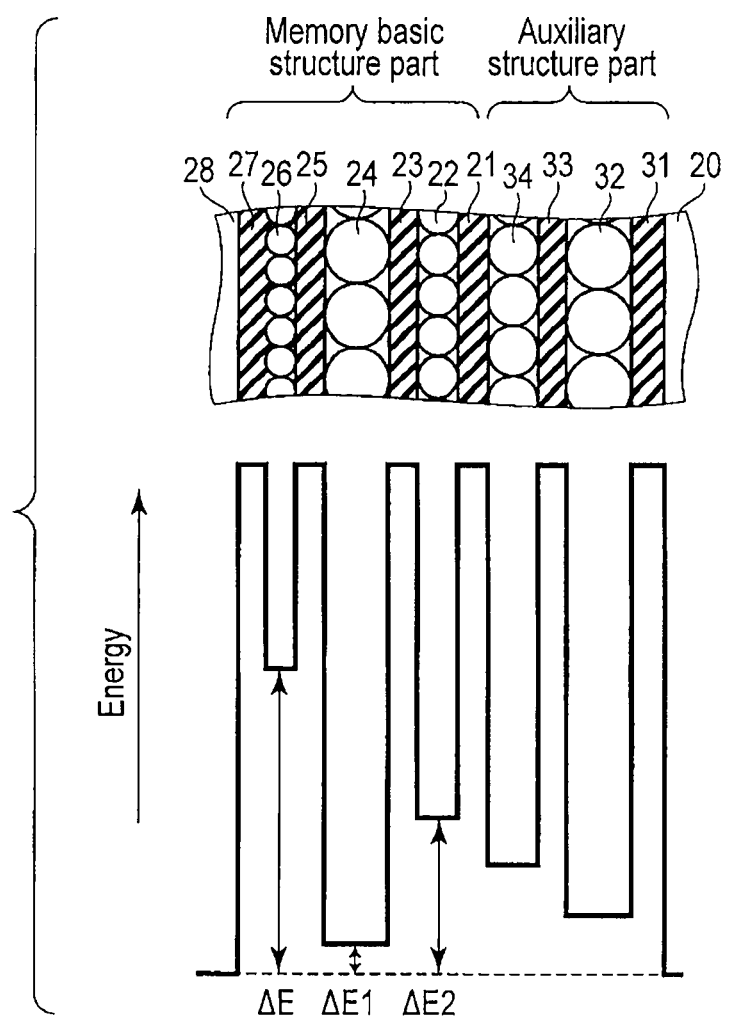
FIG. 13 is a diagram illustrating a structure and an energy structure of the memory device of the third embodiment.

FIG. 13 is a diagram illustrating an energy structure in the third embodiment.

FIG. 13 shows that energy barriers generated by the auxiliary structure part are arranged like stairs between the lower interconnection 20 and the nanocrystal layer (charge storage layer) 24.

Figure 14:
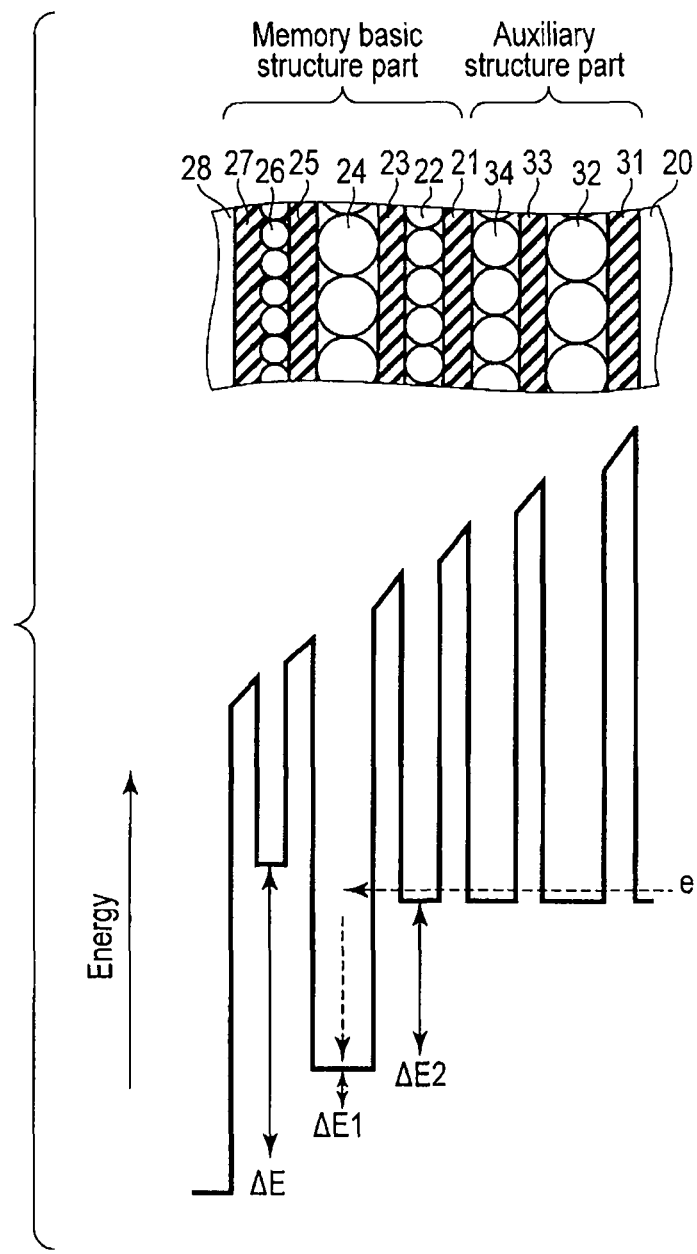
FIG. 14 is a diagram illustrating an energy structure in the memory device of the third embodiment when writing is performed.

FIG. 14 illustrates an energy structure in writing in the third embodiment.

Since high-speed writing can be performed by removing an energy barrier $\Delta E2$ from the writing tunnel, it is necessary to apply at least a potential difference of $\Delta E2$ to the three layers of the silicon oxide films 31, 33, and 21. During this process, a potential difference of the five layers of the silicon oxide films 31, 33, 21, 23, and 25 is applied between the interconnection 20 and an upper nanocrystal layer 26. When a potential difference $\Delta E2$ is applied to the silicon oxide films 31, 33, and 21, the potential difference of the five layers of the silicon oxide films is "$(5/3) \times \Delta E2$". Therefore, the condition for suppressing a piercing current in writing is "$\Delta E > (5/3) \times \Delta E2$". This means that a higher $\Delta E2$ can be obtained for the same $\Delta E$ than the condition "$\Delta E > 3 \times \Delta E2$" in the first embodiment. Thereby, the third embodiment is advantageous in securing the storage maintaining time.

Although all the five silicon oxide films 31, 33, 21, 23, 25 have the same thickness in the third embodiment, a general condition for suppressing a piercing current in writing is "$\Delta E > [(T31+T33+T21+T23+T25)/(T31+T33+T21)] \times \Delta E2$", when the respective thicknesses of the silicon oxide films are T31, T33, T21, T23, and T25.

When a diameter of minute particles in the nanocrystal layer 26 is d and a diameter of minute particles in the nanocrystal layer 22 is $d_2$, the quantum confinement effect proportional to $d^{-2}$ is remarkable as the grain size of the minute particles decreases. Therefore, a desirable condition is "$d_2 > [(T31+T33+T21+T23+T25)/(T31+T33+T21)]^{1/2} d$". When all the five silicon oxide films have the same thickness as in the third embodiment, a desirable condition is "$d_2 > (5/3)^{1/2} d$".

In addition, when a desirable condition "$d_2 > [(T31+T33+T21+T23+T25)/(T31+T33+T21)] d$" for the Coulomb blockade energy proportional to $d^{-1}$ is also satisfied, it is expected to more securely block a piercing current between the interconnections 20 and 28 in writing.

Next, erasing in the memory device of the third embodiment will be explained hereinafter.

FIG. 15 is a diagram illustrating an energy structure in erasing in the memory device of the third embodiment.

To erase information charges, a proper plus voltage should be applied to the lower interconnection 20 in the same manner as the first embodiment. Erasing can be performed by letting information charges existing in the nanocrystal layer 24 go into the lower interconnection 20 without being blocked by the energy barrier $\Delta E2$ of the nanocrystal layer 22. An erasing voltage should be applied between the interconnections 20 and 28 such that a potential difference of "$\Delta E2-\Delta E1$" or more is applied to the silicon oxide film 23.

When a plus voltage is applied to the lower interconnection 20, since the highest energy barrier $\Delta E$ exists in the vicinity of the upper interconnection 28, a piercing current between the interconnections 20 and 28 is blocked. The memory device of the third embodiment is an advantageous memory device which can achieve not only increase in erasing efficiency in erasing and low power consumption, but also rectification property which is frequently necessary in memory cell array operation, by designing the device structure, like the first embodiment.

Next, reading in the memory device of the third embodiment will be explained hereinafter.

Figures 16A, 16B:
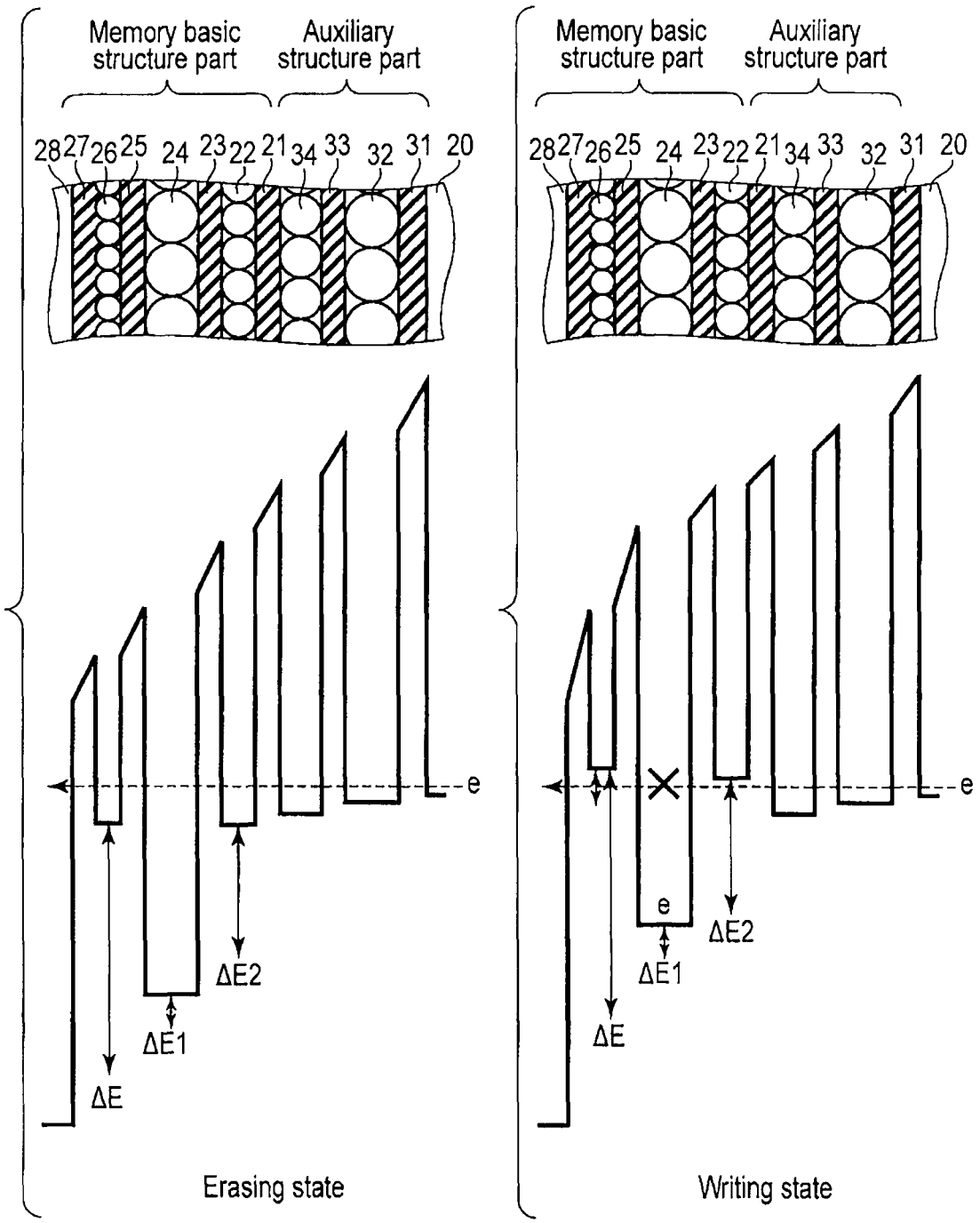
FIGS. 16A and 16B are diagrams illustrating energy structures in the memory device of the third embodiment when reading is performed.

FIG. 16A and FIG. 16B are diagrams illustrating energy structures when a reading voltage is applied to the interconnection 28 in the third embodiment.

Reading information can be performed by reading a difference in a piercing current from the lower interconnection 20 to the upper interconnection 28, in the same manner as the first embodiment.

As illustrated in FIG. 16A, in an state where no information charge exists in the nanocrystal layer 24, there are no energy barriers which block the piercing current, and thus electrons go from the lower interconnection 20 to the upper interconnection 28 in a ballistic manner. In this state, it is desirable that the nanocrystal layer 24 is sufficiently thin and the ballistic electrons pass through the nanocrystal layer 24 before energy relaxation occurs, from the viewpoint of efficiently obtaining an on current and preventing erroneous writing. It is known that silicon films having a thickness of 5 nm or less have a large effect of letting ballistic electrons go through the silicon films without energy relaxation. Therefore, the silicon thickness (grain size of silicon minute particles) of the nanocrystal layer 24 is desirably 5 nm or less.

In addition, in the memory device structure and the reading method of the present embodiment, the silicon oxide films 25 and 27 have a thin thickness of about 1 nm, and the tunnel barriers of the silicon oxide films 25 and 27 are low for ballistic electrons from the lower interconnection 20. Therefore, the memory device structure and the reading method of the present embodiment are convenient from the viewpoint of efficiently obtaining an on current and preventing erroneous writing.

On the other hand, as illustrated in FIG. 16B, when the memory device is in the written state, that is, in the written state in which information charges exist in the nanocrystal layer 24, the potential of the nanocrystal layer 24 is increased by the information charges, and thus ballistic electrons can be blocked by the energy barrier. Thereby, it is possible to decrease the reading current value. In statistical mechanics, a current value efficiently decreases in an exponential manner (decreases by one digit for an energy barrier of 60 meV) for a blocking energy barrier, and thus an on/off ratio of the reading current which corresponds to the written state and the erased state can be efficiently increased.

Although the two nanocrystal layers exists in the auxiliary structure part in the third embodiment, only one nanocrystal layer or three or more nanocrystal layers can produce the effect of easing the condition for suppressing a piercing current in writing, as long as the energy barriers are designed to be arranged like stairs.

In addition, when the interconnections are formed of metal other than n+ polysilicon also in the third embodiment, the same effect can be obtained by the same theory, by replacing the energy barriers obtained by the quantum confinement effect and the Coulomb blockade effect in the silicon nanocrystals by effective energy barriers determined in consideration of a difference between the electron affinity of Si and the work function of the metal, as explained in the second embodiment.

The following is explanation of an area of an effective memory cell in the memory devices of the first to third embodiments.

Figure 17A:
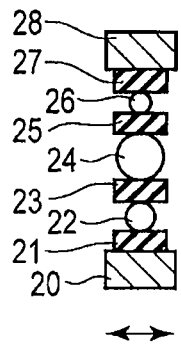
FIGS. 17A and 17B are cross-sectional views illustrating a minimum memory cell size in the memory device of the embodiment.
Figure 17B:
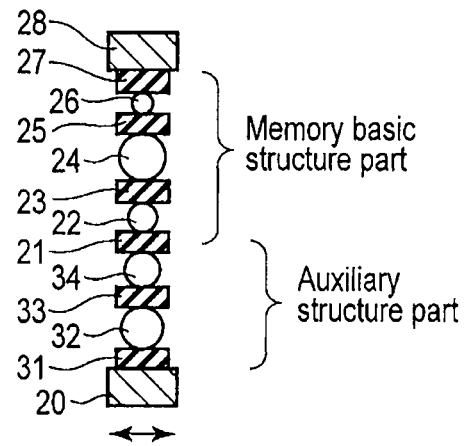

As illustrated in FIG. 17A and FIG. 17B, the memory device of the present embodiment can operate as a memory as long as each of the nanocrystal layers 22, 24, 26, 32, and 34 has at least one silicon nanocrystal. Therefore, the memory device (memory cell) can be scaled down to a cell size of several nanometers.

[Fourth Embodiment]

Although the silicon nanocrystal layer 24 is used as the layer of storing information charges in the first to third embodiments, another material may be used, as long as information charges can be stored and ballistic electrons are erroneously written in the material due to energy relaxation in reading in the erased state. The case of using another material produces the same effect as explained in the first to third embodiments. The following fourth to sixth embodiments show the case of another material is used as a charge storage layer instead of the silicon nanocrystal layer 24 in the first embodiment.

Figure 18:
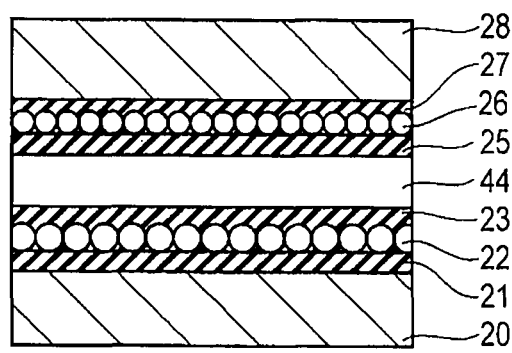
FIG. 18 is a cross-sectional view illustrating a structure of a memory device according to a fourth embodiment.

FIG. 18 is a cross-sectional view illustrating a structure of a memory device according to the fourth embodiment.

As illustrated in FIG. 18, a silicon electrode layer 44 which has a thickness of 5 nm or less is used as the charge storage layer instead of the nanocrystal layer 24 of the first embodiment, in the fourth embodiment. The silicon electrode layer 44 preferably has a thickness of 5 nm or less, to prevent energy relaxation of ballistic electrons in reading in the erased state. Any type (non-doped, n, and p) of silicon electrode layer 44 can store information charges.

To manufacture the memory device of the fourth embodiment, for example, the amorphous silicon film which corresponds to a storage part should be formed with a larger thickness than that in the first embodiment, and the heating step for forming the silicon nanocrystals should be performed at higher heating temperature for longer time. Since lateral crystal growth is more probably caused in silicon films of larger thickness, only the silicon electrode layer 44 can be a polysilicon electrode or a single-crystal silicon electrode obtained by lateral crystal growth of silicon, while the nanocrystal layers 22 and 26 are maintained to include silicon nanocrystals of a grain size which is generally equal to the thickness of the layer.

The fourth embodiment has an advantage that more information charges can be stored, since information charges are not stored in a high energy level obtained by the quantum confinement effect, unlike the nanocrystal layer 24 in the first embodiment. The other constituent elements and effects of the fourth embodiment are the same as those of the first embodiment.

[Fifth Embodiment]

FIG. 19 is a cross-sectional view illustrating a structure of a memory device according to a fifth embodiment.

As illustrated in FIG. 19, in the fifth embodiment, a silicon nitride layer 54 which has a thickness of about 3 nm is used as the charge storage layer instead of the nanocrystal layer 24 of the first embodiment. The silicon nitride film 54 includes a number of trap levels, and thus can store information charges.

In addition, it is known from writing experiments of MONOS structures that electrons which are not trapped but go through a silicon nitride film increase when the silicon nitride film has a thickness of 3 nm or less. Therefore, it is desirable that the silicon nitride film has a thickness of 3 nm or less, to prevent ballistic electrons from being erroneously written due to energy relaxation in reading in the erased state.

The method of manufacturing the memory device of the fifth embodiment is the same as the first embodiment, except for the following steps. The silicon nitride film 54 is formed on a silicon nitride film 23 by CVD. In addition, a silicon oxide film 25 can be formed on a surface of the silicon nitride film 54 by using, for example, a relatively strong oxidation condition.

The fifth embodiment has an advantage that storage retaining endurance can be improved for structure defective parts of the tunnel insulating films, by locally retaining charges by traps. The other constituent elements and effects of the fifth embodiment are the same as those of the first embodiment.

[Sixth Embodiment]

FIG. 20 is a cross-sectional view of a structure of a memory device according to a sixth embodiment.

As illustrated in FIG. 20, in the sixth embodiment, a metal electrode 64 which has a thickness of about 3 nm is used instead of the nanocrystal layer 24 in the first embodiment. The metal electrode 64 can store information charges as a matter of course. It is required that the metal electrode 64 has a small thickness, to prevent ballistic electrons from being erroneously written due to energy relaxation in reading in the erased state. Since energy relaxation caused by electron scattering is more conspicuous in the metal electrode 64 than in semiconductors, the electrode is required to have a thickness of 5 nm or less, which is standard thickness of the charge storage layer formed of polysilicon. Since the storage function of the metal electrode can be maintained even when the thickness of the electrode is reduced as the metal electrode has high state density, the metal electrode desirably has a thickness of several nanometers or less.

The method of manufacturing the memory device of the sixth embodiment is the same as the first embodiment, except for the following step.

Since a silicon oxide film 25 cannot be formed by thermal oxidation in the sixth embodiment, the silicon oxide film 25 is formed by CVD such as ALD.

In the sixth embodiment, the energy level of the metal electrode 64 serving as the charge storage layer is generally lower than a silicon conduction band edge, and thus the sixth embodiment has an advantageous structure for securing information charge quantity and maintaining storage.

In addition, when erasing is performed, it is necessary to apply a plus voltage to a lower interconnection 20 such that an electric field is applied to a silicon oxide film 23 until an energy barrier ΔE2 of a nanocrystal layer 22 becomes lower than the energy level of the metal electrode (charge storage layer) 64. It is expected that the erasing voltage which is applied to the interconnections 20 and 28 becomes large as the energy level of the metal electrode 64 is low. The other constituent elements and effects of the sixth embodiment are the same as those of the first embodiment.

[Seventh Embodiment]

FIG. 21 is a cross-sectional view illustrating a structure of a memory device according to a seventh embodiment.

As illustrated in FIG. 21, in the seventh embodiment, a metal quantum dot layer 74 which has a grain size of about 3 nm is used instead of the nanocrystal layer 24 in the first embodiment. The metal quantum dot layer 74 can store information charges as a matter of course. It is necessary to reduce the grain size of the metal quantum dot layer 74, to prevent ballistic electrons from being erroneously written due to energy relaxation in reading in an erased state. Since energy relaxation caused by electron scattering is more conspicuous in the metal quantum dot layer 74 than in semiconductors, the metal quantum dot layer 74 is required to have a thickness of 5 nm or less, which is standard thickness of the charge storage layer formed of polysilicon. Since the storage function of the metal quantum dot layer can be maintained even when the thickness of the layer is reduced as the metal quantum dot layer has high state density, the metal quantum dot layer desirably has a thickness of several nanometers or less.

The method of manufacturing the memory device of the seventh embodiment is the same as the sixth embodiment. A silicon oxide film 25 can be formed by CVD such as ALD.

In the seventh embodiment, the energy level of the metal quantum dot layer 74 serving as the charge storage layer is generally lower than a silicon conduction band edge, and thus the seventh embodiment has an advantageous structure for securing information charge quantity and retaining storage. Since the dot layer 74 is isolated, the storage retaining endurance for structure defective parts of the tunnel insulating films can be more improved than the sixth embodiment.

In addition, when erasing is performed, it is necessary to apply a plus voltage to a lower interconnection 20 such that an electric field is applied to a silicon oxide film 23 until an energy barrier ΔE2 of a nanocrystal layer 22 becomes lower than the energy level of the metal quantum dot layer 74. While it is expected that the erasing voltage which is applied between the interconnections 20 and 28 becomes large as the energy level of the metal quantum dot layer 74 is low, the erasing voltage becomes higher by the Coulomb blockade energy of metal minute particles in the dot layer 74, and thus it is expected that the erasing voltage is smaller than the erasing voltage of the sixth embodiment.

In addition, also in the above fourth to seventh embodiments, the same effect can be obtained by the same theory as a matter of course, by replacing the energy barriers obtained by the quantum confinement effect and the Coulomb blockade effect in the nanocrystal layers 22 and 26 by effective energy barriers determined in consideration of a difference between the electron affinity of silicon and a work function of the metal, like the second embodiment, even when the interconnection material is metal. Besides, the condition for suppressing a piercing current in writing can be eased also in the fourth to seventh embodiments in the same manner as the third embodiment, by adding an auxiliary structure part.

In the above first to fifth embodiments, the whole memory device can be formed of a silicon-based material, and thus highly conforms to the silicon LSI process. In addition, since memory operation can be performed with a Si nanoparticle in principle, the memory device can be miniaturized to a very small size which is equal to about the grain size of a nanoparticle of a cell area. Each operation voltage value and a current value in each state can be controlled and designed based on the tunnel resistance and the energy barrier, which basically depend on the structure factors of the thickness of the tunnel oxide films and the grain size of the silicon nanocrystals. Therefore, according to the memory device of the first to fifth embodiments, the memory characteristics and the operation can be designed by designing the device structure, that is, designing the tunnel insulating films and the minute particles (nanocrystals) which form the memory device.

The following is explanation of some desirable conditions which are necessary to produce the effects of the above embodiments.

Although the silicon nanocrystal layers 22 and 26 are used in each of the above embodiments, even when conductive minute particle layers formed of another material are used, the same effect can be obtained, since energy barriers obtained by the confinement effect are formed and large energy barriers are formed by reducing the grain size. When the conductive minute particle material is a semiconductor such as silicon, energy barriers are formed by the quantum confinement effect and the Coulomb blockade effect. When the material is metal, energy barriers are formed only by the Coulomb blockade effect, since the state density is high.

The present embodiment uses a tunnel passing through an energy level which is formed by confining carriers in conductive nanoparticles such as Si nanocrystals in a tunnel insulating film.

Specifically, the present embodiment uses the phenomenon that there is no choice for passage but to exceed the energy of the energy barrier $\Delta E$, when the energy barrier $\Delta E$ blocks carrier leak as in retaining storage, since no quantum-mechanical states exist in an energy range of an energy barrier $\Delta E$ in conductive nanoparticles. This effect can be effectively produced when the energy level $\Delta E$ in conductive nanoparticles is larger than heat fluctuation $k_B T$ ($k_B$ is Boltzman constant, T is the absolute temperature, and $k_B T$ is about 26 meV at room temperature).

The energy barrier $\Delta E$ depends on the Coulomb blockade energy when conductive nanoparticles are formed of metal material, and depends on the Coulomb blockade energy and quantum confinement energy when the conductive nanoparticles are formed of semiconductor. The Coulomb blockade energy, which is one of main causes of the energy barrier $\Delta E$, is generally estimated based on the expression "$q/(2\pi\epsilon d)$", when the grain size (diameter) is d, in the case where the conductive nanoparticles have a spherical shape or a shape close to a sphere. In the expression, q represents an elementary electric charge, and $\epsilon$ is the dielectric constant. A desirable range of the size d of the conductive nanoparticles can be estimated by using the expression.

It is desirable that the grain size d of conductive minute particles used in the present embodiment satisfies the condition "$q/(2\pi\epsilon d) > k_B T$", that is, "$d < d_{max} = q/(2\pi\epsilon k_B T)$". When a typical tunnel insulating film is a silicon oxide film, "$d_{max} = 30$ nm" is satisfied.

It is desirable that the thickness of the tunnel insulating films (silicon oxide films) is as small as possible. Since the storage maintaining function can be improved by increasing the energy barriers caused by reduction in the grain size of the silicon nanocrystals, tunnel insulating films having a smaller thickness can more securely maintain high-speed writing and erasing. A larger effect can be expected when the thickness of the tunnel insulating films is 2 nm or less, with which the tunnel insulating films themselves have low resistance. When the thickness of the tunnel insulating films is 1.5 nm or less, the resistance of the silicon oxide films themselves is further reduced, which is more desirable. The lower limit of the thickness of the tunnel insulating films is, for example, 0.3 nm which is an interatomic distance, and 0.7 nm, which is a thickness of a natural oxide film in atmosphere. In addition, although the above embodiments use silicon oxide films as the tunnel insulating film material, the present embodiment can be realized by using another insulator.

It suffices that the silicon nanocrystal layer 24 in the first to third embodiments can store charges. It is desirable, however, that the silicon nanocrystal layer 24 has a thickness of 5 nm or less, since it is desirable that energy relaxation of ballistic electrons does not occur in reading in an erased state, when the grain size (diameter) of the silicon nanocrystal layer 24 is d1. Specifically, the upper limit of the grain size can be defined as "$d1 \leq 5$ nm".

The Coulomb blockade energy in this state can be a more desirable lower limit of $\Delta E1$. Specifically, the condition is "$\Delta E1 > q/(2\pi\epsilon \times 5 \text{ nm})$", in which e represents dielectric constant of the tunnel oxide films. As the desirable upper limit of the energy barrier $\Delta E1$, it is necessary that $\Delta E1$ is smaller than $\Delta E2$, from the viewpoint of maintaining information charges. Since $\Delta E1$ must be smaller than $\Delta E2$ by a physically significant difference in energy, it is necessary that $\Delta E1$ is smaller than $\Delta E2$ by at least a difference larger than a heat fluctuation. Specifically, the desirable upper limit of the energy barrier $\Delta E1$ satisfies the condition "$\Delta E1 < \Delta E2 - k_B T$".

The desirable lower limit of the energy barrier $\Delta E2$ is obtained in the same manner. The upper limit of $\Delta E2$ should be higher than energy of information electrons of the charge storage layer of each embodiment by at least a difference larger than a difference for energy of heat fluctuation. The condition in the first to third embodiments is "$\Delta E2 > \Delta E1 + k_B T$", the condition in the fourth embodiment is "$\Delta E2 > k_B T$", and the condition in the sixth embodiment is "$\Delta E2 > k_B T - \Delta \epsilon 2$" when a difference in electron affinity between the metal of the charge storage layer and Si. In the seventh embodiment, when the size (diameter) of the metal minute particles of the charge storage layer is d1 and the dielectric constant of the tunnel insulating films is c, the condition is "$\Delta E2 > k_B T - \Delta \epsilon 2 + q/(2\pi\epsilon d1)$", since the Coulomb blockade energy of the metal particles of the charge storage layer is provided based on the expression "$q/(2\pi\epsilon d1)$".

The desirable upper limit of the energy barrier $\Delta E2$ depends on the condition for suppressing a piercing current between interconnections in writing, although the higher upper limit is more desirable from the viewpoint of maintaining storage. In the first, second, and fourth to seventh embodiments, the desirable upper limit satisfies the condition "$\Delta E > [(T21+T23+T25)/T21] \Delta E2$". In the third embodiment, the desirable upper limit satisfies the condition "$\Delta E > [(T31+T33+T21+T23+T25)/(T31+T33+T21)] \Delta E2$". Since two silicon layers are added as the auxiliary structure part in the third embodiment, the third embodiment has a different condition.

Generally, the desirable upper limit of $\Delta E2$ satisfies the condition "$\Delta E > [(\text{sum of thicknesses of tunnel oxide films from the lower interconnection to the uppermost Si nanocrystal layer 26})/(\text{sum of thicknesses of tunnel oxide films from the lower interconnection to the charge storage layer})] \Delta E2$". Since it is more desirable there is a physically significant difference between them, a more desirable upper limit satisfies the condition "$\Delta E > [(\text{sum of thicknesses of tunnel oxide films from the lower interconnection to the uppermost Si nanocrystal layer 26})/\{\text{sum of thicknesses of effective tunnel oxide films from the lower interconnection to the charge storage layer}\}] \Delta E2 + k_B T$".

The desirable upper limit of the energy barrier $\Delta E2$ is equal to the desirable lower limit of the energy barrier $\Delta E$. The desirable upper limit of $\Delta E$ should be as high as possible, from the viewpoint of maintaining storage and improving rectification characteristics to prevent leakage of a current in reverse bias (when a plus voltage is applied to the lower interconnection). As a theoretical upper limit, since at least the atomic size is the lower limit of the grain size of the silicon nanocrystals, there must be a finite upper limit of the energy barrier ΔE. Actually, the upper limit may be determined according to the control limit in a processing technique for the grain size of the minute particles.

Although the desirable ranges for the energy barriers ΔE, ΔE1, and ΔE2 have been described above, when there is a difference between the work function of the metal being the interconnection material and the electron affinity of Si as explained in the second embodiment, the same discussion is applicable when effective barriers $\Delta E_{\mathit{eff}}$, $\Delta E1_{\mathit{eff}}$, and $\Delta E2_{\mathit{eff}}$ determined in consideration of the difference in energy are used instead of the energy barriers.

When each of the energy barriers ΔE, ΔE1, and ΔE2 and the grain sizes d, d1, and d2 includes a plurality of conductive nanoparticles, they fluctuate due to fluctuations in the grain size. Therefore, the conditions for producing the effects in the case where the conductive nanoparticle layer includes a plurality of nanoparticles are obtained by using an average value for each of the energy barriers ΔE, ΔE1, and ΔE2 and the grain sizes d, d1, and d2.

In addition, although in the above discussion the grain sizes d, d1, and d2 of the conductive nanoparticles are supposed to be diameters of particles which have a spherical shape or a shape close to a sphere, actually, the nanoparticles do not always have a strict spherical shape. When they have a spherical shape, a self capacity for the diameter d is "$Cself=\pi\epsilon d$". Therefore, the Coulomb blockade energy is generally obtained by the expression "$q/(2Cself)=q/(2\pi\epsilon d)$". On the other hand, when the conductive nanoparticles have a shape which is not close to a sphere, an effective grain size d can be specified by the expression "$d=Cself/(\pi\epsilon)$" for the self capacity Cself which depends on the shape of the conductors.

In addition, although the above embodiments are formed by using nanocrystal layers which are formed by heating a-Si thin films, a method of directly forming silicon nanocrystals by LPCVD at higher temperature can be used as another method. In the case of using another method, however, the silicon nanocrystals are discretely distributed, and not always densely formed. There are cases where no sufficient effect is produced when the surface density of Si nanocrystals of the Si nanocrystal layer in the double junction structure is too low.

Generally, information electrons do not always stay at a position during the retention time of 10 years, but move in the charge storage layer somewhat. When the Si nanocrystal layer 22 has low minute particle surface density, it frequently occurs that an information electron does not exist by accident in the vicinity of each Si nanocrystal of the Si nanocrystal layer 22 being a reading current path, and thus the written information electrons cannot be accurately read out. Since an electrostatic screening length of Si is about 10 nm, it is possible to read out an information electron without being shielded by the electrostatic screen in almost the whole surface of the charge storage layer, as long as the Si nanocrystal surface density in the Si nanocrystal layer 22 is $2.5\times10^{11}\mathrm{cm}^{-2}$ (one nanocrystal for 20 nm squares) to read an information electron in the information charge storage layer.

When the Si nanocrystal layer 26 has low surface density, in most cases no Si nanocrystal of the Si nanocrystal layer 26 exists on a reading current path which passes through each Si nanocrystal of the Si nanocrystal layer 22, and reading by using a ballistic electron current cannot be performed. When the surface density of the Si nanocrystals of the Si nanocrystal layer 26 is equal to or higher than a reciprocal number of the nanocrystal cross section in the Si nanocrystal layer 22, in most cases an Si nanocrystal of the Si nanocrystal layer 26 exists on a reading current path which passes through each Si nanocrystal of the Si nanocrystal layer 22, and it is expected that reading by using a ballistic electron current can be performed.

The lower limits of the Si nanocrystal surface densities of the Si nanocrystal layers 22 and 26 are not limited to the above, when the nanocrystals and the charge storage layer can be formed in controlled positions in a self-alignment manner.

[Eighth Embodiment]

Next, a cross-point memory which includes the memory device of the first to seventh embodiments as a memory cell.

FIG. 22 is a circuit diagram illustrating a structure of a cross-point memory according to an eighth embodiment.

As illustrated in FIG. 22, word lines WL0, WL1, WL2 extend in an X direction, and arranged at predetermined intervals in a Y direction. Bit lines BL0, BL1, and BL2 extend in the Y direction, and arranged at predetermined intervals in the X direction. Memory cells MC (0-0), MC (0-1), . . . , and MC (2-2) are arranged in respective crossing parts of the word lines WL0, WL1, and WL2 and the bit lines BL0, BL1, and BL2. The memory devices of one of the above first to seventh embodiments are used as the memory cells.

The cross-point memory of the present embodiment has a structure in which only the memory device (memory cell) is disposed in each crossing part of the word line and the bit line. Since the memory device of each of the first to seventh embodiments has a rectifying function, even this structure can prevent a sneak current which is generated in reading. As a matter of course, it is possible to adopt a structure in which the memory device and a selector (for example, a diode) which suppresses a reverse current are provided in each crossing part of the word line and the bit line.

As explained above, the memory devices of the embodiments can achieve miniaturization, and have a two-terminal memory device structure in which the bidirectional current value between electrodes or interconnections, the operation voltage value, and the storage maintaining time can be controlled and designed according to the device structure design. According to the embodiments, it is possible to provide a memory device in which the bidirectional current value between interconnections or electrodes, the voltage values for writing and erasing, and the storage maintaining time can be easily controlled.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a memory cell including,
a first double tunnel junction structure which comprises a first nanocrystal layer that includes first conductive minute particles being nanocrystals, and first and second tunnel insulating films that are arranged to sandwich the first nanocrystal layer;
a second double tunnel junction structure which comprises a second nanocrystal layer that includes second conductive minute particles being nanocrystals, and third and fourth tunnel insulating films that are arranged to sandwich the second nanocrystal layer;

a charge storage layer which is arranged between the first double tunnel junction structure and the second double tunnel junction structure, and stores information charges; and first and second terminals which are arranged to sandwich the first double tunnel junction structure, the charge storage layer, and the second double tunnel junction structure, wherein the first conductive minute particles have an average grain size which is different from an average grain size of the second conductive minute particles, and a reading operation to the memory cell is performed by a current which flows through the first and second terminals, the first and second double tunnel junction structures and the charge storage layer.

2. The memory device according to claim 1, wherein the charge storage layer comprises third conductive minute particles which have an average grain size that is larger than the average grain sizes of the first and second conductive minute particles.

3. The memory device according to claim 1, wherein the first and second conductive minute particles satisfy Coulomb blockade condition.

4. The memory device according to claim 1, wherein the first and second conductive minute particles are Si nanocrystals.

5. The memory device according to claim 1, further comprising:

a fourth nanocrystal layer which comprises fourth conductive minute particles that are arranged between the first double tunnel junction structure and the first terminal, wherein the fourth conductive minute particles have an average grain size which is larger than the average grain size of the first conductive minute particles.

6. The memory device according to claim 1, wherein the first and second terminals comprise polysilicon.

7. The memory device according to claim 1, wherein the first and second terminals comprises metal.

8. A memory device comprising:
a memory cell including,
first and second terminals;
a first nanocrystal layer which is arranged between the first terminal and the second terminal, and comprises first conductive minute particles;
a first tunnel insulating film which is arranged between the first terminal and the first nanocrystal layer;
a second tunnel insulating film which is arranged between the first nanocrystal layer and the second terminal;
a second nanocrystal layer which is arranged between the second tunnel insulating film and the second terminal, and comprises second conductive minute particles;
a third tunnel insulating film which is arranged between the second tunnel insulating film and the second nanocrystal layer;
a fourth tunnel insulating film which is arranged between the second nanocrystal layer and the second terminal; and
a charge storage layer which is arranged between the second tunnel insulating film and the third tunnel insulating film, wherein the first conductive minute particles have an average grain size which is different from an average grain size of the second conductive minute particles, and a reading operation is performed by a current which flows through the first and second terminals, the first and second nanocrystal layers, the first, second, third and fourth tunnel insulating films and the charge storage layer.

9. The memory device according to claim 8, wherein the charge storage layer comprises third conductive minute particles which have an average grain size that is larger than the average grain sizes of the first and second conductive minute particles.

10. The memory device according to claim 8, wherein the first and second conductive minute particles satisfy Coulomb blockade condition.

11. The memory device according to claim 8, wherein the first and second conductive minute particles are Si nanocrystals.

12. The memory device according to claim 8, further comprising:

a fourth nanocrystal layer which comprises fourth conductive minute particles that are arranged between the first tunnel insulating film and the first terminal, wherein the fourth conductive minute particles have an average grain size which is larger than the average grain size of the first conductive minute particles.

13. The memory device according to claim 8, wherein the first and second terminals comprises polysilicon.

14. The memory device according to claim 8, wherein the first and second terminals comprises metal.

* * * * *